United States Patent
Todorokihara

(10) Patent No.: US 10,707,891 B2
(45) Date of Patent: Jul. 7, 2020

(54) TRANSITION STATE ACQUISITION DEVICE, TIME-TO-DIGITAL CONVERTER, AND A/D CONVERSION CIRCUIT

(71) Applicant: Seiko Epson Corporation, Tokyo (JP)

(72) Inventor: Masayoshi Todorokihara, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/360,077

(22) Filed: Mar. 21, 2019

(65) Prior Publication Data

US 2019/0296762 A1    Sep. 26, 2019

(30) Foreign Application Priority Data

Mar. 22, 2018   (JP) .................................. 2018-054278

(51) Int. Cl.
| | |
|---|---|
| *H03M 1/00* | (2006.01) |
| *H03M 1/50* | (2006.01) |
| *H03M 1/54* | (2006.01) |
| *G04F 10/00* | (2006.01) |
| *H03L 7/099* | (2006.01) |

(52) U.S. Cl.
CPC .......... *H03M 1/502* (2013.01); *G04F 10/005* (2013.01); *H03L 7/099* (2013.01); *H03M 1/54* (2013.01)

(58) Field of Classification Search
CPC ............ H03M 1/12; H03M 1/50; H03M 1/60; H03M 1/502; H03M 1/002; H03M 1/1009; H03M 1/00; H03M 1/125; H03M 1/121; H03M 1/1245; H03L 7/0814; H03L 7/085; H03L 7/093; H03L 2207/50; H03L 7/0991; H03L 7/081; H03L 7/091; H03L 7/099; H03L 2207/06; H03L 7/0802

USPC .......................................... 341/124, 125, 155
See application file for complete search history.

(56) References Cited

U.S. PATENT DOCUMENTS

| | | | |
|---|---|---|---|
| 5,331,294 A | 7/1994 | Watanabe et al. | |
| 5,684,760 A | 11/1997 | Hunter | |
| 7,304,510 B2 * | 12/2007 | Matsuta | ............... H03D 13/004 |
| | | | 327/3 |

(Continued)

FOREIGN PATENT DOCUMENTS

| | | |
|---|---|---|
| JE | H05-102801 A | 4/1993 |
| JP | H08-297177 A | 11/1996 |
| JP | 2011-259208 A | 12/2011 |

OTHER PUBLICATIONS

Zeng Cheng et al., "Recent Developments and Design Challenges of High-Performance Ring Oscillator CMOS Time-To-Digital Converters", IEEE Transactions on Electron Devices, vol. 63, No. 1, pp. 235-251, Jan. 2016.

*Primary Examiner* — Linh V Nguyen

(74) *Attorney, Agent, or Firm* — Harness, Dickey & Pierce, P.L.C.

(57) ABSTRACT

A transition state acquisition device includes an oscillator that includes a tapped delay line and a combination circuit provided on a signal path from one end to the other end of the tapped delay line, and oscillates based on a first signal, and a latch that captures and holds an output signal of the tapped delay line in synchronization with a second signal. The oscillator starts a transition of a state of the tapped delay line based on the first signal. An interval between timings at which the latch captures the output signals of the tapped delay line is shorter than a time during which the state transition of the tapped delay line makes one round.

11 Claims, 14 Drawing Sheets

(56) References Cited

U.S. PATENT DOCUMENTS

| | | | | |
|---|---|---|---|---|
| 2008/0309542 | A1* | 12/2008 | Tanizawa | H03M 1/089 |
| | | | | 341/163 |
| 2009/0028274 | A1* | 1/2009 | Kim | G04F 10/06 |
| | | | | 375/340 |
| 2012/0249198 | A1* | 10/2012 | Sinha | H03L 7/089 |
| | | | | 327/157 |
| 2013/0214959 | A1* | 8/2013 | Lee | H03M 1/50 |
| | | | | 341/166 |
| 2014/0055296 | A1* | 2/2014 | Miyashita | G06F 1/025 |
| | | | | 341/166 |
| 2014/0292552 | A1* | 10/2014 | Kim | G04F 10/005 |
| | | | | 341/156 |
| 2014/0354461 | A1* | 12/2014 | Kawano | H03M 1/502 |
| | | | | 341/155 |
| 2014/0375486 | A1* | 12/2014 | Chaivipas | G04F 10/005 |
| | | | | 341/118 |
| 2018/0088535 | A1* | 3/2018 | Wang | G04F 10/005 |
| 2018/0175840 | A1* | 6/2018 | Todorokihara | H03K 21/10 |

* cited by examiner

| EN | T3 | T2 | T1 | D0 |
|----|----|----|----|----|
| 0 | 0 | 0 | 0 | 0 |
| 0 | 0 | 0 | 1 | 1 |
| 0 | 0 | 1 | 1 | 0 |
| 0 | 0 | 1 | 0 | 1 |
| 0 | 1 | 1 | 0 | 0 |
| 0 | 1 | 1 | 1 | 1 |
| 0 | 1 | 0 | 1 | 0 |
| 0 | 1 | 0 | 0 | 1 |
| 1 | 0 | 0 | 0 | 1 |
| 1 | 0 | 0 | 1 | 0 |
| 1 | 0 | 1 | 1 | 1 |
| 1 | 0 | 1 | 0 | 0 |
| 1 | 1 | 1 | 0 | 1 |
| 1 | 1 | 1 | 1 | 0 |
| 1 | 1 | 0 | 1 | 1 |
| 1 | 1 | 0 | 0 | 0 |

*FIG. 7*

| D24 | D16 | D8 | T0 | D24 | D16 | D8 |
|---|---|---|---|---|---|---|
| 0 | 0 | 0 | 0 | 0 | 0 | 0 |
| 0 | 0 | 0 | 1 | 0 | 0 | 1 |
| 0 | 0 | 1 | 1 | 0 | 0 | 1 |
| 0 | 0 | 1 | 0 | 0 | 1 | 1 |
| 0 | 1 | 1 | 0 | 0 | 1 | 1 |
| 0 | 1 | 1 | 1 | 0 | 1 | 0 |
| 0 | 1 | 0 | 1 | 0 | 1 | 0 |
| 0 | 1 | 0 | 0 | 1 | 1 | 0 |
| 1 | 1 | 0 | 0 | 1 | 1 | 0 |
| 1 | 1 | 0 | 1 | 1 | 1 | 1 |
| 1 | 1 | 1 | 1 | 1 | 1 | 1 |
| 1 | 1 | 1 | 0 | 1 | 0 | 1 |
| 1 | 0 | 1 | 0 | 1 | 0 | 1 |
| 1 | 0 | 1 | 1 | 1 | 0 | 0 |
| 1 | 0 | 0 | 1 | 1 | 0 | 0 |
| 1 | 0 | 0 | 0 | 0 | 0 | 0 |

*FIG. 9*

| L24 | L16 | L8 | L0 | BSEL | TSEL[1:0] | NUM[3:0] |
|---|---|---|---|---|---|---|
| 0 | 0 | 0 | 0 | 0 | 3 | 15 |
| 0 | 0 | 0 | 1 | 1 | 0 | 0 |
| 0 | 0 | 1 | 1 | 1 | 1 | 1 |
| 0 | 0 | 1 | 0 | 0 | 0 | 2 |
| 0 | 1 | 1 | 0 | 1 | 2 | 3 |
| 0 | 1 | 1 | 1 | 1 | 0 | 4 |
| 0 | 1 | 0 | 1 | 0 | 1 | 5 |
| 0 | 1 | 0 | 0 | 0 | 0 | 6 |
| 1 | 1 | 0 | 0 | 1 | 3 | 7 |
| 1 | 1 | 0 | 1 | 1 | 0 | 8 |
| 1 | 1 | 1 | 1 | 1 | 1 | 9 |
| 1 | 1 | 1 | 0 | 0 | 0 | 10 |
| 1 | 0 | 1 | 0 | 0 | 2 | 11 |
| 1 | 0 | 1 | 1 | 1 | 0 | 12 |
| 1 | 0 | 0 | 1 | 0 | 1 | 13 |
| 1 | 0 | 0 | 0 | 0 | 0 | 14 |

TRANSITION STATE ACQUISITION DEVICE, TIME-TO-DIGITAL CONVERTER, AND A/D CONVERSION CIRCUIT

BACKGROUND

1. Technical Field

The present invention relates to a transition state acquisition device, a time-to-digital converter, and an A/D conversion circuit.

2. Related Art

JP-A-8-297177 discloses a time interval measurement circuit in which an input pulse signal representing a time interval whose period is measured is supplied, a state of a ring oscillator is latched at the end of the input pulse signal, a "rough" value with respect to a length of the time interval to be measured is obtained from a count value recorded in a high frequency counter, and a "refined" value of a period fraction of the ring oscillator is obtained from a latched value. Accordingly, it is possible to acquire a transition state of the ring oscillator by combining the "rough" value and the "refined" value.

However, in the time interval measurement circuit disclosed in JP-A-8-297177, there is a need to separate the high-frequency counter for obtaining the "rough" value with respect to the length of the time interval to be measured and the latching for obtaining the "refined" value of the period fraction of the ring oscillator. Therefore, there is a problem that complication occurs because the special effort is required for taking consistency in combining the "rough" count value and the "refined" count value.

SUMMARY

An aspect of a transition state acquisition device according to the invention includes an oscillator that includes a tapped delay line and a combination circuit provided on a signal path from one end to the other end of the tapped delay line, and oscillates based on a first signal, and a latch that captures and holds an output signal of the tapped delay line in synchronization with a second signal. The oscillator starts a transition of a state of the tapped delay line based on the first signal. An interval between timings at which the latch captures the output signals of the tapped delay line is shorter than a time during which the state transition of the tapped delay line makes one round.

In the aspect of the transition state acquisition device, the oscillator may include a plurality of the tapped delay lines and at least some of the plurality of tapped delay lines may be connected in parallel. In a transition of values of a plurality of specific signals output from the plurality of tapped delay lines, a Hamming distance before and after the transition may be 1.

The aspect of the transition state acquisition device may further include a counter that counts the number of times the state of the tapped delay line transitions based on a value held by the latch.

The aspect of the transition state acquisition device may further include a counter that counts the number of times the state of the tapped delay line transitions based on a value held by the latch. The counter may obtain a first count value as an approximate value of the number of times the state of the tapped delay line transitions based on values that the latch captures and holds the plurality of specific signals, may obtain a second count value by specifying the tapped delay line of which the state is transitioned at a timing when the latch captures the plurality of specific signals among the plurality of tapped delay lines based on the values that the latch captures and holds the plurality of specific signals and by performing a population count with respect to the value that the latch captures and holds the signal output from the specified tapped delay line, and may obtain the number of times the state of the tapped delay line transitions based on the first count value and the second count value.

An aspect of a time-to-digital converter according to the invention includes the transition state acquisition device described above, a count value holder that captures and holds a count value counted by the counter of the transition state acquisition device, and an integrator that integrates the count value held by the count value holder to generate a first time-to-digital value corresponding to a time interval between a time event of the first signal and a time event of the second signal.

In the aspect of the time-to-digital converter, the time event of the second signal may be set independently of the time event of the first signal.

The aspect of the time-to-digital converter may further include a time-to-digital value generator. The oscillator may start a transition of a state of the tapped delay line based on each of a plurality of the first signals. The counter may count the number of times the state of the tapped delay line transitions with respect to each of the plurality of first signals. The count value holder may capture and hold a plurality of the count values counted by the counter. The integrator may integrate each of the plurality of count values held by the count value holder to generate a plurality of the first time-to-digital values corresponding to a time interval between the time event of each of the plurality of first signals and the time event of the second signal. The time-to-digital value generator may generate a second time-to-digital value corresponding to a time interval of at least two time events of the plurality of first signals based on the plurality of first time-to-digital values.

An aspect of a time-to-digital converter according to the invention includes a plurality of the transition state acquisition devices described above, a plurality of count value holders, a plurality of integrators, and a time-to-digital value generator. The plurality of transition state acquisition devices start a transition of a state of the tapped delay line based on each of a plurality of the first signals. The plurality of count value holders capture and hold a count value counted by the counter of each of the plurality of transition state acquisition devices. The plurality of integrators integrate each of the plurality of count values held by the plurality of count value holders to generate a plurality of first time-to-digital values corresponding to a time interval between a time event of each of the plurality of first signals and a time event of the second signal. The time-to-digital value generator generates a second time-to-digital value corresponding to a time interval of at least two time events of the plurality of first signals based on the plurality of first time-to-digital values generated by the plurality of integrators.

In the aspect of the time-to-digital converter, the time event of the second signal may be set independently of the time events of the plurality of first signals.

An aspect of an A/D conversion circuit according to the invention converts an input analog signal into a digital signal and outputs the converted digital signal. The A/D conversion circuit includes the time-to-digital converter described above, a reference waveform signal generation circuit that generates a reference waveform signal based on the second signal, and a comparator that compares a voltage of the analog signal with a voltage of the reference waveform signal to output the first signal. The digital signal based on the first time-to-digital value generated by the time-to-digital converter is output.

An aspect of an A/D conversion circuit according to the invention converts an input analog signal into a digital signal and outputs the converted digital signal. The A/D conversion circuit includes the time-to-digital converter described above, a sample-hold circuit that samples and holds a voltage of the analog signal, a reference waveform signal generation circuit that generates a reference waveform signal based on the second signal, and a comparator that compares a voltage held by the sample-hold circuit with a voltage of the reference waveform signal to output the first signal. The A/D conversion circuit outputs the digital signal based on the first time-to-digital value generated by the time-to-digital converter.

BRIEF DESCRIPTION OF THE DRAWINGS

The invention will be described with reference to the accompanying drawings, wherein like numbers reference like elements.

FIG. 7 is a diagram showing a truth table of look-up tables 26-1, 26-2, and 26-3.

FIG. 9 is a diagram showing a truth table of a look-up table 49.

DESCRIPTION OF EXEMPLARY EMBODIMENTS

Hereinafter, preference embodiments of the invention will be described in detail with reference to the drawings. The embodiments described below do not unduly limit the contents of the invention described in the appended claims. Further, not all of configurations described below are necessarily essential components of the invention.

1. Transition State Acquisition Device
1-1. Functional Configuration

Figure 1:
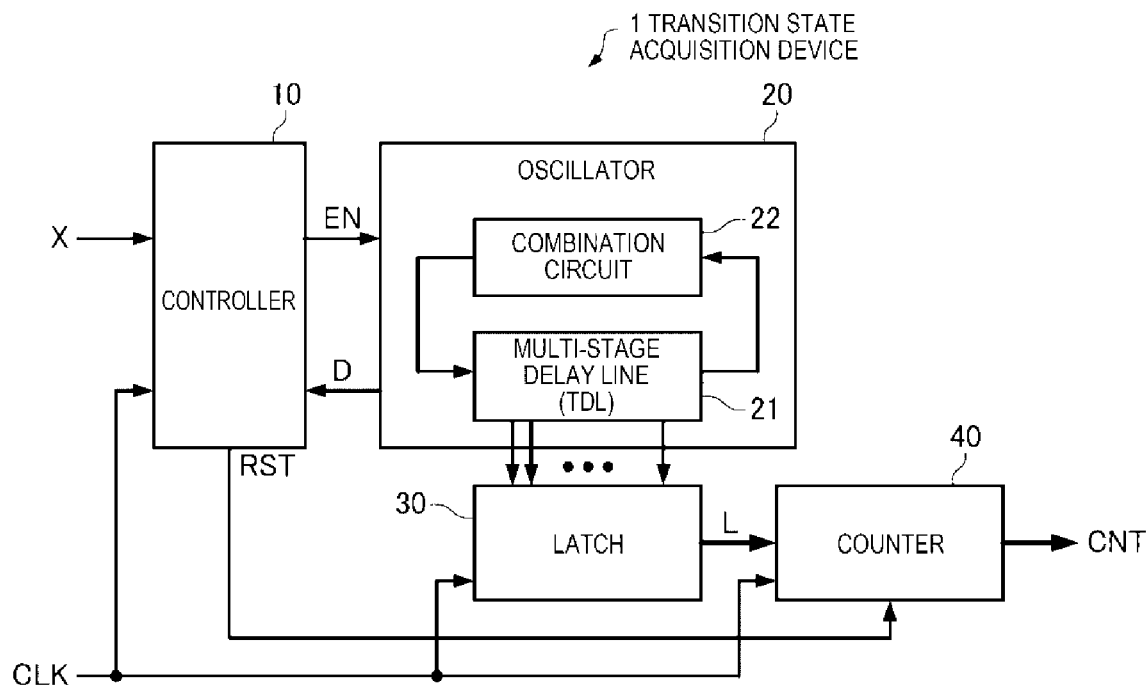
FIG. 1 is a functional block diagram of a transition state acquisition device according to an embodiment.

FIG. 1 is a functional block diagram of a transition state acquisition device 1 according to an embodiment. As shown in FIG. 1, the transition state acquisition device 1 according to the embodiment includes a controller 10, an oscillator 20, a latch 30, and a counter 40.

The controller 10 detects a rising edge of a signal to be measured X, and activates and outputs an enable signal EN. In the embodiment, the enable signal EN is assumed to be active at a high level. The controller 10 sets the enable signal EN to the high level and then determines whether a tapped delay line 21 included in the oscillator 20 transitions to a predetermined state based on a signal D output from the oscillator 20. In a case where it is determined that the transition is made, the controller 10 switches the enable signal EN from the high level to a low level. Further, the enable signal EN is switched from the high level to the low level and then the controller 10 generates and outputs a reset signal RST which is activated after a predetermined time. In the embodiment, the reset signal RST is assumed to be active at the high level. The controller 10 sets the reset signal RST to the high level and then switches the reset signal RST from the high level to the low level at a time point when a predetermined time elapses. The enable signal EN is supplied to the oscillator 20, and the reset signal RST is supplied to the counter 40.

The oscillator 20 has the tapped delay line 21 and a combination circuit 22. The tapped delay line 21 is a delay line in which a signal path from an input end to an output end of a final stage is configured of a chain of delay elements such as a plurality of buffer elements and inverter elements, and has one input end and the output ends of a plurality of stages. The tapped delay line 21 is also referred to as a tapped delay line (TDL). In the embodiment, the input end of the delay element at the head of the chain is the input end of the tapped delay line 21. Further, each input end of the plurality of delay elements configuring the chain and the output end of the delay element at the end of the chain are the output ends of each stage of the tapped delay line 21. That is, the input end of the delay element at the head of the chain is also the output end of an initial stage of the tapped delay line 21, and the output end of the delay element at the end of the chain is the output end of the final stage of the tapped delay line 21. Accordingly, in the embodiment, each input signal of the plurality of delay elements is output from the output end of each stage excluding the final stage of the tapped delay line 21, and an output signal of the delay element at the end of the chain is output from the output end of the final stage of the tapped delay line 21.

The signal D described above may be at least one of the signals output from the output ends of the plurality of stages of the tapped delay line 21.

The combination circuit 22 is provided on the signal path from the output end of the final stage which is one end of the tapped delay line 21 to the input end which is the other end. The oscillator 20 stops an oscillation when the enable signal EN is at the low level and oscillates when the enable signal EN becomes the high level. Specifically, when the enable signal EN is at the low level, the signal output from the output end of the final stage of the tapped delay line 21 is input to the input end of the tapped delay line 21 without being logically inverted in the combination circuit 22. Therefore, the oscillation of the oscillator 20 stops. Further, when the enable signal EN becomes the high level, the signal output from the output end of the final stage of the tapped delay line 21 is input to the input end of the tapped delay line 21 with being logically inverted in the combination circuit 22. Therefore, the state of the tapped delay line 21 transitions and the oscillator 20 oscillates. In the embodiment, since the enable signal EN is switched from the low level to the high level by the rising edge of the signal to be measured X, the oscillator 20 starts the transition of the state of the tapped delay line 21 based on the signal to be measured X. An oscillation period of the oscillator 20 is decided according to a delay time required for the signal to propagate through the tapped delay line 21 and the combination circuit 22, and the oscillation period is shorter as the delay time is shorter.

The latch 30 captures and holds the output signal from the output end of each stage of the tapped delay line 21 in synchronization with a reference clock signal CLK capture.

The counter 40 counts the number of times the state of the tapped delay line 21 transitions based on a value L held by the latch 30. The counter 40 may receive the reset signal RST. In this case, the counter 40 counts the number of times the state of the tapped delay line 21 transitions when the reset signal RST is at the low level and initializes a value counted when the reset signal RST is at the high level to zero.

The signal to be measured X corresponds to a "first signal" in the invention. Further, the reference clock signal CLK corresponds to a "second signal" in the invention.

Hereinafter, a specific configuration example of the transition state acquisition device 1 according to the embodiment will be described.

1-2. First Configuration Example

Figure 2:
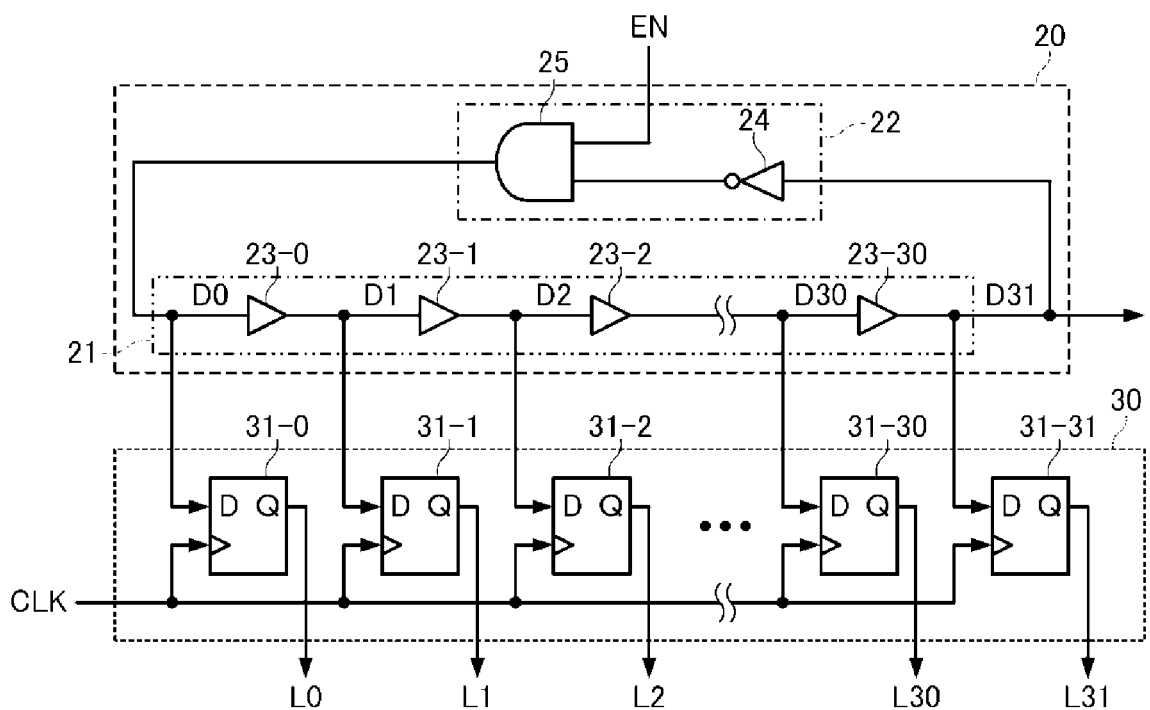
FIG. 2 is a diagram showing an oscillator and a latch in a first configuration example of the transition state acquisition device.

FIG. 2 is a diagram showing the oscillator 20 and the latch 30 in a first configuration example of the transition state acquisition device 1.

As shown in FIG. 2, in the first configuration example of the transition state acquisition device 1, the oscillator 20 includes 31 buffer elements 23-0 to 23-30, a logic inversion circuit 24, and a 2-input AND circuit 25. The output end of the buffer element 23-i (i is each of zero to 29) is electrically connected to the input end of the buffer element 23-(i+1). The output end of the buffer element 23-30 is electrically connected to the input end of the logic inversion circuit 24. In the AND circuit 25, one input end receives the enable signal EN and the other input end is electrically connected to the output end of the logic inversion circuit 24. The output end of the AND circuit 25 is electrically connected to the input end of the buffer element 23-0. The 31 buffer elements 23-0 to 23-30 configuring the chain corresponds to the tapped delay line 21 shown in FIG. 1. Further, the circuit configured of the logic inversion circuit 24 and the 2-input AND circuit 25 corresponds to the combination circuit 22 shown in FIG. 1.

In such an oscillator 20, since the enable signal EN is set to the low level to hold the output signal of the AND circuit 25 at the low level, it is possible to maintain the oscillation stopped. At this time, the tapped delay line 21 is in a first state in which signals D0 to D30 respectively input to the buffer elements 23-0 to 23-30 and a signal D31 output from the buffer element 23-30 are all at the low level.

When the enable signal EN becomes the high level, a logic inversion signal of the low level signal D31 passes through the logic inversion circuit 24 and the AND circuit 25. Therefore, the output signal of the AND circuit 25 is changed from the low level to the high level, and the signal D0 input to the buffer element 23-0 becomes the high level. Accordingly, the tapped delay line 21 transitions from the first state to a second state in which the signal D0 is at the high level and the signals D1 to D31 are at the low level. Next, when the high level signal D0 passes through the buffer element 23-0, the output signal of the buffer element 23-0 is changed from the low level to the high level and the signal D1 input to the buffer element 23-1 becomes the high level. Accordingly, the tapped delay line 21 transitions from the second state to a third state in which the signals D0 and D1 are at the high level and the signals D2 to D31 are at the low level. Thereafter, the tapped delay line 21 repeats the state transition and is in a 33rd state in which the signals D0 to D31 are all at the high level.

Next, when the high level signal D31 passes through the logic inversion circuit 24 and the AND circuit 25, the output signal of the AND circuit 25 is changed from the high level to the low level and the signal D0 input to the buffer element 23-0 becomes the low level. Accordingly, the tapped delay line 21 transitions from the 33rd state to a 34th state in which the signal D0 is at the low level and the signals D1 to D31 are at the high level. Next, the low level signal D0 passes through the buffer element 23-0, the output signal of the buffer element 23-0 is changed from the high level to the low level and the signal D1 input to the buffer element 23-1 becomes the low level. Accordingly, the tapped delay line 21 transitions from the 34th state to a 35th state in which the signals D0 and D1 are at the low level and the signals D2 to D31 are at the high level. Thereafter, the tapped delay line 21 repeats the state transition and is in a 64th state in which the signals D0 to D30 are at the low level and the signal D31 is at the high level.

Next, the low level signal D30 passes through the buffer element 23-30, the output signal of the buffer element 23-30 is changed from the high level to the low level and the signal D31 output from the buffer element 23-30 becomes the low level. Accordingly, the tapped delay line 21 returns from the 64th state to the first state in which the signals D0 to D31 are all at the low level. In this manner, the tapped delay line 21 repeats the state transition from the first state to the 64th state while the enable signal EN is at the high level. Accordingly, the oscillator 20 oscillates.

The input end of the buffer element 23-0 corresponds to the input end of the tapped delay line 21 and the output end of the initial stage (first stage) thereof, and respective output ends of the buffer elements 23-0 to 23-30 respectively corresponds to the output ends of a second stage to the final stage (32nd stage) of the tapped delay line 21. The signals D0 to D31 are respectively output from the output ends of the initial stage to the final stage of the tapped delay line 21.

The latch 30 includes 32 D flip-flops 31-0 to 31-31. In the D flip-flop 31-i (i is each of zero to 30), a data input terminal (D) is electrically connected to the input end of the buffer element 23-i and a clock input terminal receives the reference clock signal CLK. The D flip-flop 31-i captures a signal Di in synchronization with the rising edge of the reference clock signal CLK and holds a value Li corresponding to a logic level. Further, in the D flip-flop 31-31, the data input terminal (D) is electrically connected to the output end of the buffer element 23-30 and the clock input terminal receives the reference clock signal CLK. The D flip-flop 31-31 captures a signal D31 in synchronization with the rising edge of the reference clock signal CLK and holds a value L31 corresponding to the logic level.

Figure 3:
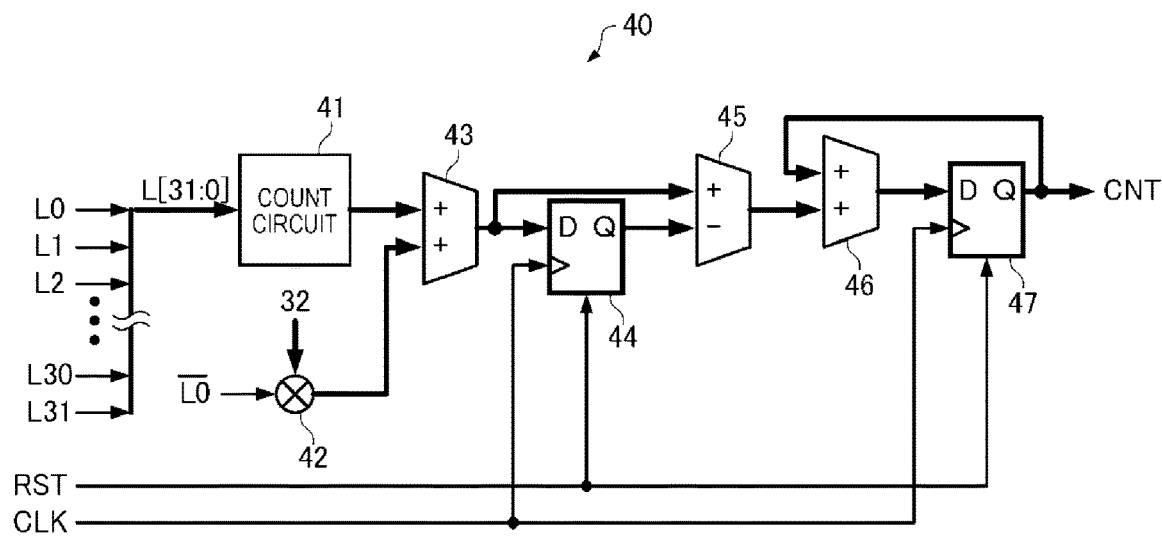
FIG. 3 is a diagram showing a counter in the first configuration example.

FIG. 3 is a diagram showing the counter 40 in the first configuration example of the transition state acquisition device 1. As shown in FIG. 3, the counter 40 includes a count circuit 41, a multiplier 42, an adder 43, a D flip-flop 44, a subtractor 45, an adder 46, and a D flip-flop 47. Only one D flip-flop 44 and one D flip-flop 47 are respectively illustrated for the sake of simplicity of illustration in FIG. 3. However, there are actually six D flip-flops 44 and N D flip-flops 47.

The count circuit 41 performs a population count of the number of zeroes or ones with respect to a 32-bit value of L0 to L31 held by the latch 30 and outputs a six-bit signal having any value of zero to 32. Specifically, the count circuit 41 counts the number of zeroes with respect to L0 to L31 when L0 is zero and counts the number of ones with respect to L0 to L31 when L0 is one.

The multiplier 42 multiplies a value obtained by logically inverting L0 and 32, and outputs a six-bit signal having a value of zero or 32. That is, the multiplier 42 outputs zero when L0 is one and outputs 32 when L0 is zero. The multiplier 42 can be realized as a simple circuit that shifts the value obtained by logically inverting L0 by five bits.

The adder 43 adds a value of the six-bit signal output from the count circuit 41 and a value of the six-bit signal output from the multiplier 42, and outputs a six-bit calculation value.

Here, in a case where the latch 30 captures the signals D0 to D31 when the tapped delay line 21 is in a j-th state (j is each of 1 to 64), the value of the six-bit signal output from the adder 43 is j-1.

For example, while the state of the tapped delay line 21 is in the states from the second state, in which the signal D0 is at the high level and the signals D1 to D31 are at the low level, to the 33rd state, in which the signals D0 to D31 are all at the high level, the high level signal propagates through the tapped delay line 21. In a case where the rising edge of the reference clock signal CLK comes when the state of the tapped delay line 21 is in any state of the second state to the 33rd state, the value L0 corresponding to the logic level of the signal D0 is one. Accordingly, for example, in a case where the latch 30 captures the signals D0 to D31 when the tapped delay line 21 is in the 33rd state, the value of the six-bit signal output from the count circuit 41 is 32 and the value of the six-bit signal output from the multiplier 42 is zero. Therefore, a value of a seven-bit signal output from the adder 43 is 32.

Further, for example, while the state of the tapped delay line 21 is in the states from the 34th state, in which the signal D0 is at the low level and the signals D1 to D31 are at the high level, to the first state, in which the signals D0 to D31 are all at the low level, the low level signal propagates through the tapped delay line 21. In a case where the rising edge of the reference clock signal CLK comes when the state of the tapped delay line 21 is in any state of the 34th state to the first state, the value L0 corresponding to the logic level of the signal D0 is zero. Accordingly, for example, in a case where the latch 30 captures the signals D0 to D31 when the tapped delay line 21 is in the 34th state, the value of the six-bit signal output from the count circuit 41 is one and the value of the six-bit signal output from the multiplier 42 is 32. Therefore, a value of a seven-bit signal output from the adder 43 is 33. In a case where the latch 30 captures the signals D0 to D31 when the tapped delay line 21 is in the first state, the value of the six-bit signal output from the count circuit 41 is 32 and the value of the six-bit signal output from the multiplier 42 is 32. Therefore, a value obtained by adding these values is 64 (seven-bit value 1000000). However, since the signal output from the adder 43 is six-bit, the value is zero (=0000000).

Each of the six D flip-flops 44 captures and holds each value of the six-bit signal output from the adder 43 in synchronization with the rising edge of the reference clock signal CLK.

The subtractor 45 subtracts the six-bit value held by the six D flip-flops 44 from the value of the six-bit signal output from the adder 43 and outputs a six-bit signal having any value of zero to 63. The value of the six-bit signal output from the subtractor 45 corresponds to the number of times the state of the tapped delay line 21 transitions during a time of the latest one period of the reference clock signal CLK.

The adder 46 adds the value of the six-bit signal output from the subtractor 45 and a six-bit value held by six D flip-flops 47, and outputs a N-bit signal. Further, in a case where the addition value is equal to or larger than an N-bit upper limit value, the adder 46 outputs the N-bit signal having the upper limit value. For example, when N=7, the adder 46 outputs a seven-bit signal having any value of zero to 127.

Each of the N D flip-flops 47 captures and holds each value of the N-bit signal output from the adder 46 in synchronization with the rising edge of the reference clock signal CLK. The N-bit value held by the N D flip-flops 47 is output from the counter 40 as an N-bit count value CNT. This count value CNT corresponds to the number of times the state of the tapped delay line 21 transitions from the transition of the enable signal EN from the low level to the high level. When the reset signal RST is changed from the low level to the high level, the values respectively held by the six D flip-flops 44 and the N D flip-flops 47 are all initialized to zero. Accordingly, the count value CNT is also initialized to zero, and next measurement is possible.

As described above, with the first configuration example of the transition state acquisition device 1 according to the embodiment, it is possible to acquire the number of times the state of the tapped delay line 21 transitions as the count value CNT.

As a timing at which the latch 30 first captures the signals D0 to D31 after the enable signal EN transitions from the low level to the high level, that is, a time to the first rising edge of the reference clock signal CLK is longer, the number of times the state of the tapped delay line 21 transitions during this time is larger. Therefore, the count value CNT becomes larger. Accordingly, it is possible to measure the time to the first rising edge of the reference clock signal CLK after the enable signal EN transitions from the low level to the high level by using the count value CNT.

However, when the state of the tapped delay line 21 transitions 64 times or more during a time from the capturing of the signals D0 to D31 by the latch 30 to the next capturing of the signals D0 to D31 by the latch 30, the count value CNT is an erroneous value. For example, in a case where the latch 30 captures the signals D0 to D31 when the state of the tapped delay line 21 is in the first state and then the latch 30 captures the signals D0 to D31 when the state of the tapped delay line 21 becomes the second state after 65 transitions, the state transitions of 65 times are regarded as one state transition and the count value CNT increases only by one. Therefore, in order to obtain a correct count value CNT, an interval between the timings at which the latch 30 captures the signals D0 to D31, that is, the time of one period of the reference clock signal CLK is required to be shorter than a time during which the state transition of the tapped delay line 21 makes one round. The time during which the state transition of the tapped delay line 21 makes one round is a time required for the state of the tapped delay line 21 to transition 64 times. In a case where it is difficult to shorten the time of one period of the reference clock signal CLK, the number of stages (the number of delay elements) of the tapped delay line 21 maybe increased or a signal propagation time of each delay element may be lengthened.

As described above, in the first configuration example of the transition state acquisition device 1 according to the embodiment, the interval between the timings at which the latch 30 captures the signals D0 to D31 output from the tapped delay line 21 is shorter than the time during which the state transition of the tapped delay line 21 makes one round. Therefore, it is possible to associate the values L0 to L31 held by the latch 30 with the state of the oscillator 20 on a one-to-one basis. Accordingly, with the first configuration example of the transition state acquisition device 1 according to the embodiment, since the transition state of the oscillator 20 can be acquired based on the values L0 to L31 held by the latch 30 for each rising edge of the reference clock signal CLK, it is possible to reduce complication in acquiring the transition state of the oscillator 20.

Further, with the first configuration example of the transition state acquisition device 1 according to the embodiment, since the counter 40 counts the number of times the state of the tapped delay line 21 transitions based on the values L0 to L31 held by the latch 30, it is possible to acquire the number of times the state of the tapped delay line 21 transitions as the count value CNT. As the timing at which the latch 30 first captures the signals D0 to D31 after the enable signal EN transitions from the low level to the high level, that is, the time to the first rising edge of the reference clock signal CLK is longer, the number of times the state of the tapped delay line 21 transitions during this time is larger. Therefore, the count value CNT becomes larger. Accordingly, it is possible to measure the time to the first rising edge of the reference clock signal CLK after the enable signal EN transitions from the low level to the high level by using the count value CNT.

1-3. Second Configuration Example

Figure 4:
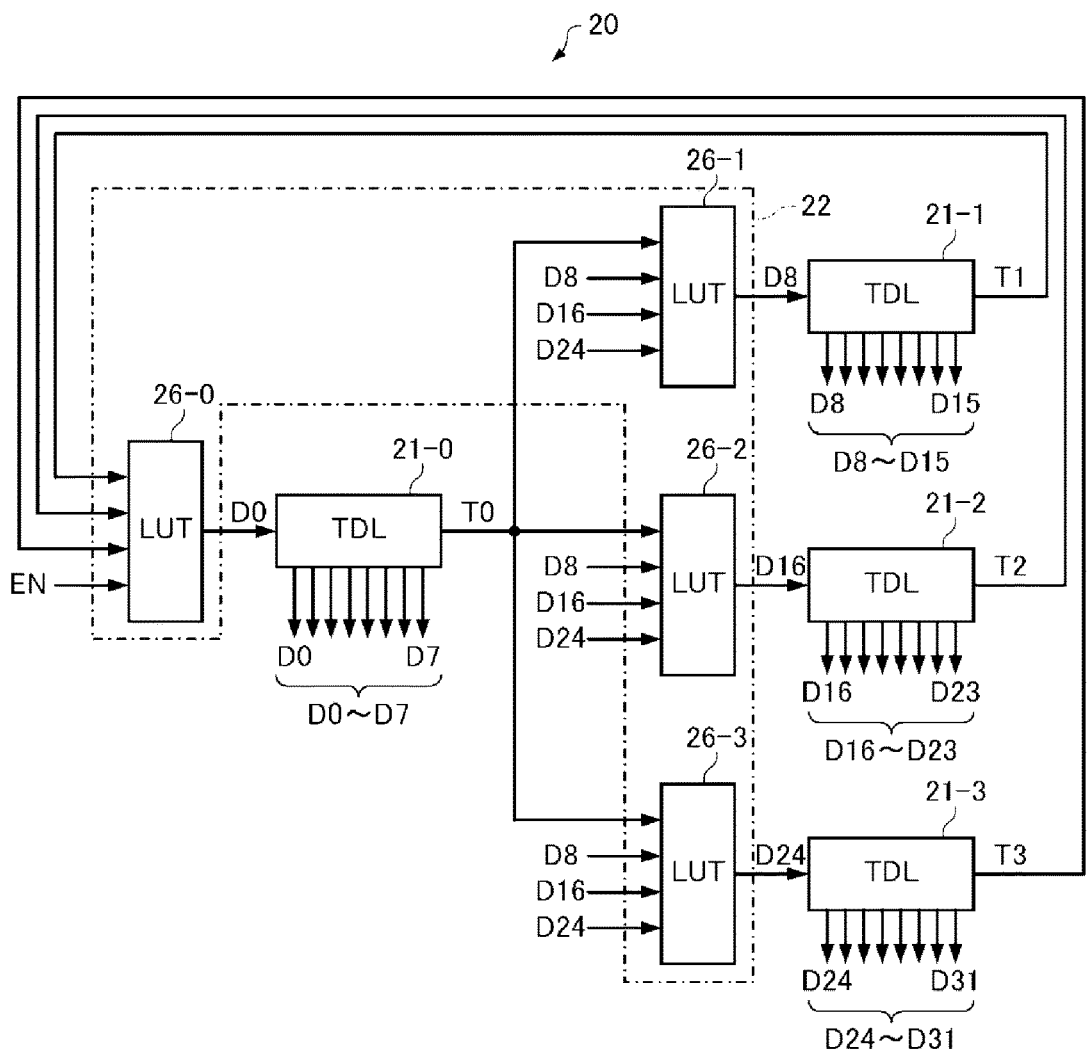
FIG. 4 is a diagram showing an oscillator in a second configuration example of the transition state acquisition device.

FIG. 4 is a diagram showing the oscillator 20 in a second configuration example of the transition state acquisition device 1. In the configuration example, the oscillator 20 has a plurality of tapped delay lines 21, and at least some of the plurality of tapped delay lines 21 are connected in parallel. Specifically, in the second configuration example of the transition state acquisition device 1 as shown in FIG. 4, the oscillator 20 includes four tapped delay lines 21-0 to 21-3 and four look-up tables 26-0 to 26-3, and the three tapped delay lines 21-1 to 21-3 are connected in parallel.

In the tapped delay line 21-0, the input end is electrically connected to an output terminal of the look-up table 26-0, and the output end of the final stage is electrically connected to a first input terminal of each of the look-up tables 26-1 to 26-3. The signal D0 output from the look-up table 26-0 is input to the input end of the tapped delay line 21-0, and a signal T0 is output from the output end of the final stage of the tapped delay line 21-0.

Figures 5, 6:
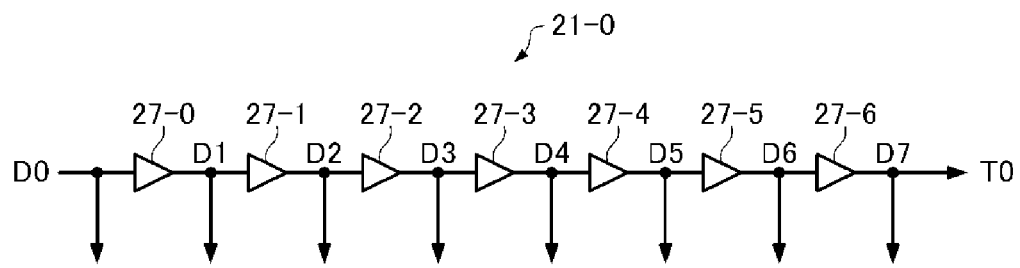
FIG. 5 is a diagram showing a configuration of a tapped delay line in the second configuration example.
FIG. 6 is a diagram showing a truth table of a look-up table 26-0.

FIG. 5 is a diagram showing a configuration of the tapped delay line 21-0. As shown in FIG. 5, the tapped delay line 21-0 includes seven buffer elements 27-0 to 27-6. The output end of the buffer element 27-i (i is each of 0 to 5) is electrically connected to the input end of the buffer element 27-(i+1). The input end of the buffer element 27-0 corresponds to the input end of the tapped delay line 21-0 and the output end of the initial stage (first stage) thereof, and respective output ends of the buffer elements 27-1 to 27-6 respectively corresponds to the output ends of the second stage to the final stage (eighth stage) of the tapped delay line 21-0. Signals D0 to D7 are respectively output from the output ends of the initial stage to the final stage of the tapped delay line 21-0, and the signal D7 is supplied to the look-up tables 26-1 to 26-3 as the signal T0.

In the tapped delay line 21-1, the input end is electrically connected to the output terminal of the look-up table 26-1, and the output end is electrically connected to the first input terminal of the look-up table 26-0. A signal D8 output from the look-up table 26-1 is input to the input end of the tapped delay line 21-1, and a signal T1 is output from the output end of the final stage of the tapped delay line 21-1. Signals D8 to D15 are respectively output from the output ends of the initial stage to the final stage (eighth stage) of the tapped delay line 21-1, and the signal D15 is supplied to the look-up table 26-0 as the signal T1. Since the configuration of the tapped delay line 21-1 is the same as the configuration of the tapped delay line 21-0 shown in FIG. 5, the illustration thereof is omitted.

In the tapped delay line 21-2, the input end is electrically connected to the output terminal of the look-up table 26-2, and the output end is electrically connected to a second input terminal of the look-up table 26-0. A signal D16 output from the look-up table 26-2 is input to the input end of the tapped delay line 21-2, and a signal T2 is output from the output end of the final stage of the tapped delay line 21-2. Signals D16 to D23 are respectively output from the output ends of the initial stage to the final stage (eighth stage) of the tapped delay line 21-2, and the signal D23 is supplied to the look-up table 26-0 as the signal T2. Since the configuration of the tapped delay line 21-2 is the same as the configuration of the tapped delay line 21-0 shown in FIG. 5, the illustration thereof is omitted.

In the tapped delay line 21-3, the input end is electrically connected to the output terminal of the look-up table 26-3, and the output end is electrically connected to a third input terminal of the look-up table 26-0. A signal D24 output from the look-up table 26-3 is input to the input end of the tapped delay line 21-3, and a signal T3 is output from the output end of the final stage of the tapped delay line 21-3. Signals D24 to D31 are respectively output from the output ends of the initial stage to the final stage (eighth stage) of the tapped delay line 21-3, and the signal D31 is supplied to the look-up table 26-0 as the signal T3. Since the configuration of the tapped delay line 21-3 is the same as the configuration of the tapped delay line 21-0 shown in FIG. 5, the illustration thereof is omitted.

In the look-up table 26-0, the signal T1 is input to the first input terminal, the signal T2 is input to the second input terminal, the signal T3 is input to the third input terminal, and the enable signal EN is input to a fourth input terminal.

In the look-up table 26-1, the signal T0 is input to the first input terminal, the signal D8 is input to the second input terminal, the signal D16 is input to the third input terminal, and the signal D24 is input to the fourth input terminal.

In the look-up table 26-2, the signal T0 is input to the first input terminal, the signal D8 is input to the second input terminal, the signal D16 is input to the third input terminal, and the signal D24 is input to the fourth input terminal.

In the look-up table 26-3, the signal T0 is input to the first input terminal, the signal D8 is input to the second input terminal, the signal D16 is input to the third input terminal, and the signal D24 is input to the fourth input terminal.

The look-up table 26-0 outputs the signal D0 having a logic level corresponding to a combination of the logic levels of the signals T1, T2, and T3 and the enable signal EN according to a truth table shown in FIG. 6. Further, the look-up tables 26-1, 26-2, and 26-3 outputs the signals D8, D16, and D24 having logic levels corresponding to combinations of the logic levels of the signals D8, D16, and D24 and the signal T0 according to a truth table shown in FIG. 7. In FIGS. 6 and 7, "0" corresponds to the low level, and "1" corresponds to the high level.

A circuit configured of the look-up tables 26-0 to 26-3 corresponds to the combination circuit 22 shown in FIG. 1.

In such an oscillator 20, it is possible to maintain the oscillation stopped by setting the enable signal EN to the low level. In a case where the oscillation is stopped when the tapped delay lines 21-0 to 21-3 are in the first state in which the signals D0 to D31 are all at the low level, the signals T3, T2, and T1 are all at the low level when the enable signal EN becomes the high level. Therefore, the signal D0 output from the look-up table 26-0 is changed from the low level to the high level. Accordingly, the tapped delay lines 21-0 to 21-3 transition from the first state to the second state in which the signals D1 to D31 are at the low level and the signal D0 is at the high level. Thereafter, the high level signal propagates through the tapped delay line 21-0, and the tapped delay lines 21-0 to 21-3 repeat the state transitions and are in a ninth state in which the signals D8 to D31 are at the low level and the signals D0 to D7 are at the high level. In this ninth state, the signals T3, T2, and T1 are at the low level, and the signal T0 is at the high level.

Next, since the signals D24, D16, and D8 are at the low level and the signal T0 is at the high level, the signal D8 output from the look-up table 26-1 is changed from the low level to the high level. Accordingly, the tapped delay lines 21-0 to 21-3 transition from the ninth state to a tenth state in which the signals D9 to D31 are at the low level and the signals D0 to D8 are at the high level. Thereafter, the high level signal propagates through the tapped delay line 21-1, and the tapped delay lines 21-0 to 21-3 repeat the state transitions and are in a 17th state in which the signals D16 to D31 are at the low level and the signals D0 to D15 are at the high level. In this 17th state, the signals T3 and T2 are at the low level, and the signals T1 and T0 are at the high level.

Next, since the signals T3 and T2 are at the low level and the signal T1 is at the high level, the signal D0 output from the look-up table 26-0 is changed from the high level to the low level. Accordingly, the tapped delay lines 21-0 to 21-3 transition from the 17th state to an 18th state in which the signals D0 and D16 to D31 are at the low level and the signals D1 to D15 are at the high level. Thereafter, the low level signal propagates through the tapped delay line 21-0, and the tapped delay lines 21-0 to 21-3 repeat the state transitions and are in a 25th state in which the signals D0 to D7 and D16 to D31 are at the low level and the signals D8 to D15 are at the high level. In this 25th state, the signals T3, T2, and T0 are at the low level, and the signal T1 is at the high level.

Next, since the signals D24, D16, and T0 are at the low level and the signal D8 is at the high level, the signal D16 output from the look-up table 26-2 is changed from the low level to the high level. Accordingly, the tapped delay lines 21-0 to 21-3 transition from the 25th state to a 26th state in which the signals D0 to D7 and D17 to D31 are at the low level and the signals D8 to D16 are at the high level. Thereafter, the high level signal propagates through the tapped delay line 21-2, and the tapped delay lines 21-0 to 21-3 repeat the state transitions and are in a 33rd state in which the signals D0 to D7 and D24 to D31 are at the low level and the signals D8 to D23 are at the high level. In this 33rd state, the signals T3 and T0 are at the low level, and the signals T2 and T1 are at the high level.

Next, since the signal T3 is at the low level and the signals T2 and T1 are at the high level, the signal D0 output from the look-up table 26-0 is changed from the low level to the high level. Accordingly, the tapped delay lines 21-0 to 21-3 transition from the 33rd state to a 34th state in which the signals D1 to D7 and D24 to D31 are at the low level and the signals D0 and D8 to D23 are at the high level. Thereafter, the high level signal propagates through the tapped delay line 21-0, and the tapped delay lines 21-0 to 21-3 repeat the state transitions and are in a 41st state in which the signals D24 to D31 are at the low level and the signals D0 to D23 are at the high level. In this 41st state, the signal T3 is at the low level, and the signals T2, T1, and T0 are at the high level.

Next, since the signal D24 is at the low level and the signals D16, D8, and T0 are at the high level, the signal D8 output from the look-up table 26-1 is changed from the high level to the low level. Accordingly, the tapped delay lines 21-0 to 21-3 transition from the 41st state to a 42nd state in which the signals D8 and D24 to D31 are at the low level and the signals D0 to D7 and D9 to D23 are at the high level. Thereafter, the low level signal propagates through the tapped delay line 21-1, and the tapped delay lines 21-0 to 21-3 repeat the state transitions and are in a 49th state in which the signals D8 to D15 and D24 to D31 are at the low level and the signals D0 to D7 and D16 to D23 are at the high level. In this 49th state, the signals T3 and T1 are at the low level, and the signals T2 and T0 are at the high level.

Next, since the signals T3 and T1 are at the low level and the signal T2 is at the high level, the signal D0 output from the look-up table 26-0 is changed from the high level to the low level. Accordingly, the tapped delay lines 21-0 to 21-3 transition from the 49th state to a 50th state in which the signals D0, D8 to D15, and D24 to D31 are at the low level and the signals D1 to D7 and D16 to D23 are at the high level. Thereafter, the low level signal propagates through the tapped delay line 21-0, and the tapped delay lines 21-0 to 21-3 repeat the state transitions and are in a 57th state in which the signals D0 to D15 and D24 to D31 are at the low level and the signals D16 to D23 are at the high level. In this 57th state, the signals T3, T1, and T0 are at the low level, and the signal T2 is at the high level.

Next, since the signals D24, D8, and T0 are at the low level and the signal D16 is at the high level, the signal D24 output from the look-up table 26-3 is changed from the low level to the high level. Accordingly, the tapped delay lines 21-0 to 21-3 transition from the 57th state to a 58th state in which the signals D0 to D15 and D23 to D31 are at the low level and the signals D16 to D24 are at the high level. Thereafter, the high level signal propagates through the tapped delay line 21-3, and the tapped delay lines 21-0 to 21-3 repeat the state transitions and are in a 65th state in which the signals D0 to D15 are at the low level and the signals D16 to D31 are at the high level. In this 65th state, the signals T1 and T0 are at the low level, and the signals T3 and T2 are at the high level.

Next, since the signal T1 is at the low level and the signals T3 and T2 are at the high level, the signal D0 output from the look-up table 26-0 is changed from the low level to the high level. Accordingly, the tapped delay lines 21-0 to 21-3 transition from the 65th state to a 66th state in which the signals D1 to D15 are at the low level and the signals D0 and D16 to D31 are at the high level. Thereafter, the high level signal propagates through the tapped delay line 21-0, and the tapped delay lines 21-0 to 21-3 repeat the state transitions and are in a 73rd state in which the signals D8 to D15 are at the low level and the signals D0 to D7 and D16 to D31 are at the high level. In this 73rd state, the signal T1 is at the low level, and the signals T3, T2, and T0 are at the high level.

Next, since the signal D8 is at the low level and the signals D24, D16, and T0 are at the high level, the signal D8 output from the look-up table 26-1 is changed from the low level to the high level. Accordingly, the tapped delay lines 21-0 to 21-3 transition from the 73rd state to a 74th state in which the signals D9 to D15 are at the low level and the signals D0 to D8 and D16 to D31 are at the high level. Thereafter, the high level signal propagates through the tapped delay line 21-1, and the tapped delay lines 21-0 to 21-3 repeat the state transitions and are in an 81st state in which the signals D0 to D31 are all at the high level. In this 81st state, the signals T3, T2, T1, and T0 are all at the high level.

Next, since the signals T3, T2, and T1 are at the high level, the signal D0 output from the look-up table 26-0 is changed from the high level to the low level. Accordingly, the tapped delay lines 21-0 to 21-3 transition from the 81st state to a 82nd state in which the signal D0 is at the low level and the signals D1 to D31 are at the high level. Thereafter, the low level signal propagates through the tapped delay line 21-0, and the tapped delay lines 21-0 to 21-3 repeat the state transitions and are in an 89th state in which the signals D0 to D7 are at the low level and the signals D8 to D31 are at the high level. In this 89th state, the signal T0 is at the low level, and the signals T3, T2, and T1 are at the high level.

Next, since the signal T0 is at the low level and the signals D24, D16, and D8 are at the high level, the signal D16 output from the look-up table 26-2 is changed from the high level to the low level. Accordingly, the tapped delay lines 21-0 to 21-3 transition from the 89th state to a 90th state in which the signals D0 to D7 and D16 are at the low level and the signals D8 to D15 and D15 to D31 are at the high level. Thereafter, the low level signal propagates through the tapped delay line 21-2, and the tapped delay lines 21-0 to 21-3 repeat the state transitions and are in a 97th state in which the signals D0 to D7 and D16 to D23 are at the low level and the signals D8 to D15 and D24 to D31 are at the high level. In this 97th state, the signals T2 and T0 are at the low level, and the signals T3 and T1 are at the high level.

Next, since the signal T2 is at the low level and the signals 13 and T1 are at the high level, the signal D0 output from the look-up table 26-0 is changed from the low level to the high level. Accordingly, the tapped delay lines 21-0 to 21-3 transition from the 97th state to a 98th state in which the signals D1 to D7 and D16 to D23 are at the low level and the signals D0, D8 to D15, and D24 to D31 are at the high level. Thereafter, the high level signal propagates through the tapped delay line 21-0, and the tapped delay lines 21-0 to 21-3 repeat the state transitions and are in a 105th state in which the signals D16 to D23 are at the low level and the signals D0 to D15 and D24 to D31 are at the high level. In this 105th state, the signal T2 is at the low level, and the signals T3, T1, and T0 are at the high level.

Next, since the signal D16 is at the low level and the signals D24, D8, and T0 are at the high level, the signal D8 output from the look-up table 26-1 is changed from the high level to the low level. Accordingly, the tapped delay lines 21-0 to 21-3 transition from the 105th state to a 106th state in which the signals D8 and D16 to D23 are at the low level and the signals D0 to D7, D9 to D15, and D24 to D31 are at the high level. Thereafter, the low level signal propagates through the tapped delay line 21-1, and the tapped delay lines 21-0 to 21-3 repeat the state transitions and are in a 113th state in which the signals D8 to D23 are at the low level and the signals D0 to D7 and D24 to D31 are at the high level. In this 113th state, the signals T2 and T1 are at the low level, and the signals T3 and T0 are at the high level.

Next, since the signals T2 and T1 are at the low level and the signal T3 is at the high level, the signal D0 output from the look-up table 26-0 is changed from the high level to the low level. Accordingly, the tapped delay lines 21-0 to 21-3 transition from the 113th state to a 114th state in which the signals D0 and D8 to D23 are at the low level and the signals D1 to D7 and D24 to D31 are at the high level. Thereafter, the low level signal propagates through the tapped delay line 21-0, and the tapped delay lines 21-0 to 21-3 repeat the state transitions and are in an 121st state in which the signals D0 to D23 are at the low level and the signals D24 to D31 are at the high level. In this 121st state, the signals T2, T1, and T0 are at the low level, and the signal T3 is at the high level.

Next, since the signals D16, D8, and T0 are at the low level and the signal D24 is at the high level, the signal D24 output from the look-up table 26-3 is changed from the high level to the low level. Accordingly, the tapped delay lines 21-0 to 21-3 transition from the 121st state to a 122nd state in which the signals D0 to D24 are at the low level and the signals D25 to D31 are at the high level. Thereafter, the low level signal propagates through the tapped delay line 21-3, and the tapped delay lines 21-0 to 21-3 repeat the state transitions, are in a 128th state in which the signals D0 to D30 are at the low level and the signal D31 is at the high level, and then return to the first state in which the signals D0 to D31 are all at the low level.

Figure 8:
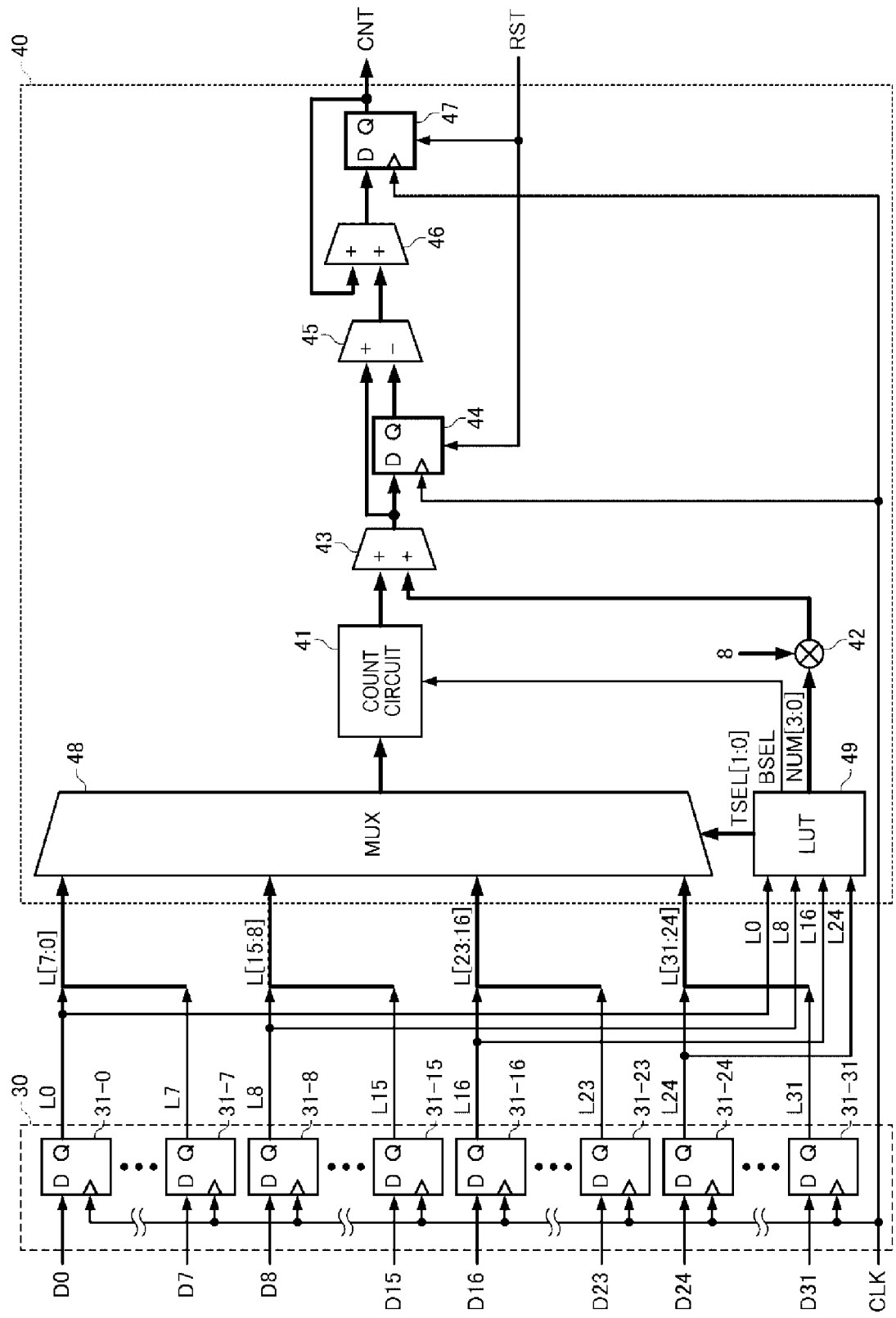
FIG. 8 is a diagram showing a latch and a counter in the second configuration example.

FIG. 8 is a diagram showing the latch 30 and the counter 40 in the second configuration example of the transition state acquisition device 1.

As shown in FIG. 8, the latch 30 includes the 32D flip-flops 31-0 to 31-31. In the eight D flip-flops 31-0 to 31-7, the data input terminal (D) is electrically connected to the output ends of the initial stage to the final stage (eighth stage) of the tapped delay line 21-0, respectively. In the eight D flip-flops 31-8 to 31-15, the data input terminal (D) is electrically connected to the output ends of the initial stage to the final stage (eighth stage) of the tapped delay line 21-1, respectively. In the eight D flip-flops 31-16 to 31-23, the data input terminal (D) is electrically connected to the output ends of the initial stage to the final stage (eighth stage) of the tapped delay line 21-2, respectively. In the eight D flip-flops 31-24 to 31-31, the data input terminal (D) is electrically connected to the output ends of the initial stage to the final stage (eighth stage) of the tapped delay line 21-3, respectively. Further, the reference clock signal CLK is input to the clock input terminals of the D flip-flops 31-0 to 31-31. The D flip-flop 31-i (i is each of 0 to 31) captures a signal Di in synchronization with the rising edge of the reference clock signal CLK and holds a value Li corresponding to a logic level.

The counter 40 includes the count circuit 41, the multiplier 42, the adder 43, the D flip-flop 44, the subtractor 45, the adder 46, the D flip-flop 47, a multiplexer 48, and the look-up table 49. Only one D flip-flop 44 and one D flip-flop 47 are respectively illustrated for the sake of simplicity of illustration in FIG. 8. However, there are actually seven D flip-flops 44 and N D flip-flops 47.

In the look-up table 49, the value L0 held by the D flip-flop 31-0 is input to the first input terminal, the value L8 held by the D flip-flop 31-8 is input to the second input terminal, the value L16 held by the D flip-flop 31-16 is input to the third input terminal, and the value L24 held by the D flip-flop 31-24 is input to the fourth input terminal. The look-up table 49 outputs a bit selection signal BSEL, a two-bit tapped delay line selection signal TSEL, and a four-bit transition number demodulation signal NUM based on a four-bit value of L24, L16, L8, and L0 according to a truth table shown in FIG. 9. The bit selection signal BSEL is a signal indicating whether a target to be counted is zero or one. The tapped delay line selection signal TSEL is a signal indicating which of the tapped delay lines 21-0 to 21-3 is a tapped delay line through which the signal propagates. The transition number demodulation signal NUM is a signal indicating the number of the tapped delay lines in which the propagation of the signal ends.

The multiplexer 48 selects any one of an eight-bit value of L7 to L0, an eight-bit value of L15 to L8, an eight-bit value of L23 to L16, and an eight-bit value of L31 to L24 based on the two-bit tapped delay line selection signal TSEL, and outputs the eight-bit signal. Specifically, the multiplexer 48 selects and outputs the eight-bit value of L7 to L0 as long as the value of the tapped delay line selection signal TSEL is zero. Further, the multiplexer 48 selects and outputs the eight-bit value of L15 to L8 as long as the value of the tapped delay line selection signal TSEL is one. Further, the multiplexer 48 selects and outputs the eight-bit value of L23 to L16 as long as the value of the tapped delay line selection signal TSEL is two. Further, the multiplexer 48 selects and outputs the eight-bit value of L31 to L24 as long as the value of the tapped delay line selection signal TSEL is three.

The count circuit 41 performs the population count of the number of zeroes or ones based on the bit selection signal BSEL with respect to the eight-bit signal output from the multiplexer 48 and outputs a four-bit signal having any value of zero to eight. Specifically, the count circuit 41 counts the number of zeroes when the value of the bit selection signal BSEL is zero and counts the number of ones when the value of the bit selection signal BSEL is one.

The multiplier 42 multiplies the value of the four-bit transition number demodulation signal NUM and eight. That is, the multiplier 42 outputs a seven-bit signal having a value eight times the value of the transition number demodulation signal NUM. The multiplier 42 can be realized as a simple circuit that shifts the value of the transition number demodulation signal NUM by three bits.

The adder 43 adds the value of the four-bit signal output from the count circuit 41 and the value of the seven-bit signal output from the multiplier 42, and outputs a seven-bit signal having any value of zero to 127.

Here, in a case where the latch 30 captures the signals D0 to D31 when the tapped delay lines 21-0 to 21-3 are in a j-th state (j is each of one to 128), the value of the seven-bit signal output from the adder 43 is j-1.

For example, while the states of the tapped delay lines 21-0 to 21-3 are in the states from an 18th state in which the signals D0 and D16 to D31 are at the low level and the signals D1 to D15 are at the high level to a 25th state in which the signals D0 to D7 and D16 to D31 are at the low level and the signals D8 to D15 are at the high level, the propagation of the high level signal through the tapped delay line 21-0 and further the tapped delay line 21-1 ends and then the low level signal propagates the tapped delay line 21-0. In a case where the rising edge of the reference clock signal CLK comes when the states of the tapped delay lines 21-0 to 21-3 are in any state of the 18th state to the 25th state, the four-bit value of L24, L16, L8, and L0 corresponding to the logic levels of the signals D24, D16, D8, and D0 is zero, zero, one, and zero. At this time, as shown in FIG. 9, the value of the bit selection signal BSEL is zero (indicates that low level signal propagates), the value of the tapped delay line selection signal TSEL is zero (indicates that signal propagates tapped delay line 21-0), and the transition number demodulation signal NUM is two (indicates that the number of tapped delay lines in which propagation of signal ends is two). Accordingly, in a case where the latch 30 captures the signals D0 to D31 when the tapped delay lines 21-0 to 21-3 are in the 25th state, the value of the four-bit signal output from the count circuit 41 is eight. Therefore, the value of the seven-bit signal output from the adder 43 is 24.

In a case where the latch 30 captures the signals D0 to D31 when the tapped delay lines 21-0 to 21-3 are in the first state, the value of the four-bit signal output from the count circuit 41 is eight and the value of the seven-bit signal output from the multiplier 42 is 120. Therefore, a value obtained by adding these values is 128 (eight-bit value 10000000). However, since the signal output from the adder 43 is seven-bit, the value is zero (=0000000).

Each of the seven D flip-flops 44 captures and holds each value of the seven-bit signal output from the adder 43 in synchronization with the rising edge of the reference clock signal CLK.

The subtractor 45 subtracts the value of the seven-bit value held by the seven D flip-flops 44 from the value of the seven-bit signal output from the adder 43, and outputs a seven-bit signal having any value of zero to 127. The value of the seven-bit signal output from the subtractor 45 corresponds to the number of times the states of the tapped delay lines 21-0 to 21-3 transition during the time of the latest one period of the reference clock signal CLK.

For example, in a case where the states of the tapped delay lines 21-0 to 21-3 transition 15 times from the first state to the 16th state during the time of the latest one period of the reference clock signal CLK, the value of the seven-bit signal output from the adder 43 is 15 and the seven-bit value held by the seven D flip-flops 44 is zero. Accordingly, the value of the seven-bit signal output from the subtractor 45 is 15 which is equal to the number of state transitions of the tapped delay lines 21-0 to 21-3 during this time. Further, in a case where the states of the tapped delay lines 21-0 to 21-3 transition 32 times from a 124th state to a 28th state during the time of the latest one period of the reference clock signal CLK, the value of the seven-bit signal output from the adder 43 is 27 and the seven-bit value held by the seven D flip-flops 44 is 123. Accordingly, a value obtained by subtracting these values is −96 (eight-bit value 10100000). However, since the signal output from the subtractor 45 is seven-bit, the value is 32 (=0100000).

The adder 46 adds the value of the seven-bit signal output from the subtractor 45 and a seven-bit value held by seven D flip-flops 47, and outputs an N-bit signal. Further, in a case where the addition value is equal to or larger than an N-bit upper limit value, the adder 46 outputs the N-bit signal having the upper limit value. For example, when N=8, the adder 46 outputs an eight-bit signal having any value of zero to 255.

Each of the N D flip-flops 47 captures and holds each value of the N-bit signal output from the adder 46 in synchronization with the rising edge of the reference clock signal CLK. The N-bit value held by the N D flip-flops 47 is output from the counter 40 as an N-bit count value CNT. This count value CNT corresponds to the number of times the states of the tapped delay lines 21-0 to 21-3 transition from the transition of the enable signal EN from the low level to the high level. When the reset signal RST is changed from the low level to the high level, the values respectively held by the seven D flip-flops 44 and the N D flip-flops 47 are all initialized to zero. Accordingly, the count value CNT is also initialized to zero, and next measurement is possible.

However, when the states of the tapped delay lines 21-0 to 21-3 transition 128 times or more during a time from the capturing of the signals D0 to D31 by the latch 30 to the next capturing of the signals D0 to D31 by the latch 30, the count value CNT is an erroneous value. For example, in a case where the latch 30 captures the signals D0 to D31 when the states of the tapped delay lines 21-0 to 21-3 are in the first state and then the latch 30 captures the signals D0 to D31 when the states of the tapped delay lines 21-0 to 21-3 become the second state after 129 transitions, the state transitions of 129 times are regarded as one state transition and the count value CNT increases only by one. Therefore, in order to obtain a correct count value CNT, an interval between the timings at which the latch 30 captures the signals D0 to D31, that is, the time of one period of the reference clock signal CLK is required to be shorter than a time during which the state transitions of the tapped delay lines 21-0 to 21-3 make one round. The time during which the state transitions of the tapped delay lines 21-0 to 21-3 make one round is a time required for the states of the tapped delay lines 21-0 to 21-3 to transition 128 times. In a case where it is difficult to shorten the time of one period of the reference clock signal CLK, the number of stages (the number of delay elements) of the tapped delay lines 21-0 to 21-3 may be increased or a signal propagation time of each delay element may be lengthened.

Further, timings of the state transitions of the tapped delay lines 21-0 to 21-3 in the oscillator 20 are asynchronous with the rising edge of the reference clock signal CLK. Therefore, if there is a state transition in which two or more logic levels of the signals D24, D16, D8, and D0 are changed in the tapped delay lines 21-0 to 21-3, there is a possibility that the latch 30 captures the values of the signals D24, D16, D8, and D0 in transient states which are neither states before the transition nor states after the transition in synchronization with the rising edge of the reference clock signal CLK and the four-bit value of L24, L16, L8, and L0 is an erroneous value. As a result, the bit selection signal BSEL, the tapped delay line selection signal TSEL, and the transition number demodulation signal NUM which are output by the look-up table 49 based on the four-bit value of L24, L16, L8, and L0 are also erroneous values and the correct count value CNT cannot be obtained.

On the contrary, in the configuration example, the states of the tapped delay lines 21-0 to 21-3 transition such as the values of the signals D24, D16, D8, and D0 transition in orders of "0000", "0001", "0011", "0010", "0110", "0111", "0101", "0100", "1100", "1101", "1111", "1110", "1010", "1011", "1001", "1000", "0000", and, . . . that is, according to a four-bit Gray code. In the Gray code, a Hamming distance is 1 and only one bit is changed in two codes adjacent to each other. Accordingly, the latch 30 always captures the values of the signals D24, D16, D8, and D0 in the states before the transitions of the tapped delay lines 21-0 to 21-3 or in the states after the transitions of the tapped delay lines 21-0 to 21-3 in synchronization with the rising edge of the reference clock signal CLK, and the four-bit value of L24, L16, L8, and L0 is always a correct value.

In this manner, with the configuration example, the Hamming distance before and after the transition is 1 and only one of the values of the signals D24, D16, D8, and D0 is changed before and after the transition in the transition of the specific four signals D24, D16, D8, and D0 which are output from the four tapped delay lines 21-0 to 21-3 and are used in the look-up table 49. Therefore, the correct count value CNT can be obtained.

The transition of the values of the four signals D24, D16, D8, and D0 may not be a transition according to the Gray code as long as the Hamming distance before and after the transition is 1.

As described above, in the second configuration example of the transition state acquisition device 1 according to the embodiment, since the interval between the timings at which the latch 30 captures the signals D0 to D31 output from the tapped delay lines 21-0 to 21-3 is shorter than the time during which the state transitions of the tapped delay lines 21-0 to 21-3 make one round. Therefore, it is possible to associate the values L0 to L31 held by the latch 30 with the state of the oscillator 20 on a one-to-one basis. Accordingly, with the second configuration example of the transition state acquisition device 1 according to the embodiment, since the transition state of the oscillator 20 can be acquired based on the values L0 to L31 held by the latch 30 for each rising edge of the reference clock signal CLK, it is possible to reduce complication in acquiring the transition state of the oscillator 20.

Further, in the second configuration example of the transition state acquisition device 1 according to the embodiment, the counter 40 obtains a first count value as an approximate value of the number of times the states of the tapped delay lines 21-0 to 21-3 transition based on the values L24, L16, L8, and L0 that the latch 30 captures and holds the specific four signals D24, D16, D8, and D0 by the multiplexer 48, the look-up table 49, and the multiplier 42. Further, the counter 40 specifies the tapped delay line of which the state is transitioned at a timing when the latch 30 captures the signals D24, D16, D8, and D0 of the four tapped delay lines 21-0 to 21-3 based on the values L24, L16, L8, and L0 captured and held by the latch 30 by the look-up table 49, and obtains a second count value by performing the population count with respect to the value that the latch 30 captures and holds the signal output from the specified tapped delay line by the count circuit 41. The counter 40 obtains the number of times the states of the tapped delay lines 21-0 to 21-3 transition based on the first count value and the second count value by the adder 43, the D flip-flop 44, the subtractor 45, the adder 46, and the D flip-flop 47. Accordingly, with the second configuration example of the transition state acquisition device 1 according to the embodiment, it is possible to acquire the number of times the states of the tapped delay lines 21-0 to 21-3 transition as the count value CNT. As the timing at which the latch 30 first captures the signals D0 to D31 after the enable signal EN transitions from the low level to the high level, that is, the time to the first rising edge of the reference clock signal CLK is longer, the number of times the states of the tapped delay lines 21-0 to 21-3 transition during this time is larger. Therefore, the count value CNT becomes larger. Accordingly, it is possible to measure the time to the first rising edge of the reference clock signal CLK after the enable signal EN transitions from the low level to the high level by using the count value CNT.

Further, it is possible to obtain the same count value CNT as when the number of stages of the tapped delay line 21 is set to 64 in the first configuration example even with the total number of stages of the tapped delay lines 21-0 to 21-3 of 32 in the second configuration example of the transition state acquisition device 1 according to the embodiment. Accordingly, with the second configuration example of the transition state acquisition device 1 according to the embodiment, it is relatively easy to make the interval between the timings at which the latch 30 captures the signals D0 to D31 shorter than the time during which the state transitions of the tapped delay lines 21-0 to 21-3 make one round, and is advantageous to reduce a circuit area.

Further, in the second configuration example of the transition state acquisition device 1 according to the embodiment, since the count circuit 41 only needs to perform the population count with respect to the eight-bit value of the 32-bit value of L0 to L31 held by the latch 30, it is possible to reduce a size of the count circuit 41.

2. Time to Digital Converter

Next, a time-to-digital converter (TDC) by using the transition state acquisition device 1 will be described.

2-1. First Embodiment

A first embodiment of a time-to-digital converter 2 generates a time-to-digital value TD corresponding to a time interval between a time event of the signal to be measured X and a time event of the reference clock signal CLK. The time event is at least one of the rising edge and the rising edge.

Figure 10:
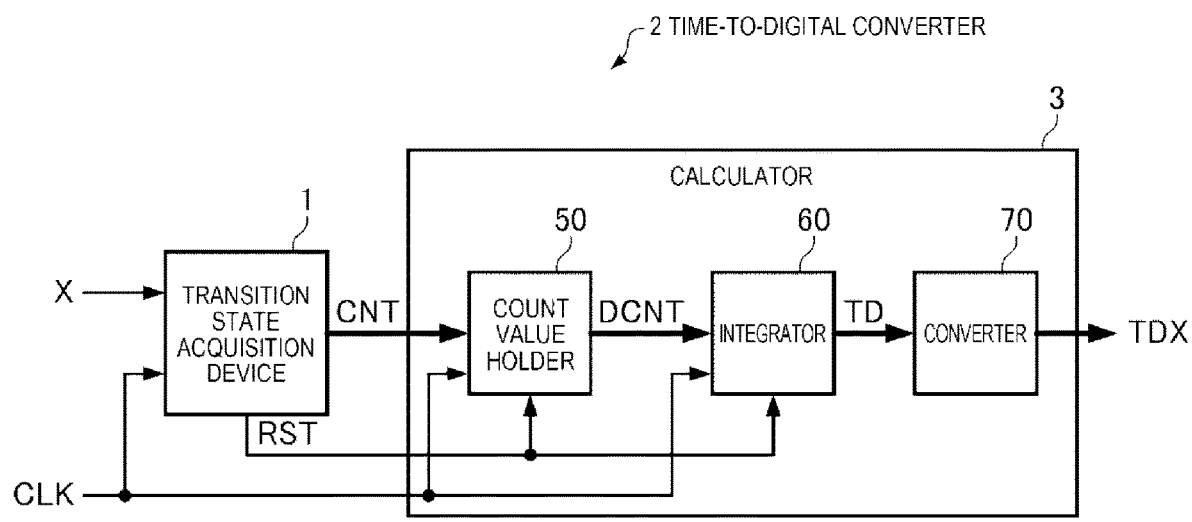
FIG. 10 is a diagram showing a configuration in a first embodiment of a time-to-digital converter.

FIG. 10 is a diagram showing a configuration in the first embodiment of the time-to-digital converter 2. As shown in FIG. 10, the first embodiment of the time-to-digital converter 2 includes the transition state acquisition device 1 and a calculator 3.

The calculator 3 includes a count value holder 50, an integrator 60, and a converter 70.

The count value holder 50 captures the count value CNT output from the transition state acquisition device 1 in synchronization with the reference clock signal CLK and holds the value as a count value DCNT. In the count value holder 50, the count value DCNT is held when the reset signal RST output from the transition state acquisition device 1 is at the low level and the count value DCNT is initialized to zero when the reset signal RST becomes the high level.

The integrator 60 integrates the count value DCNT held by the count value holder 50 to generate the time-to-digital value TD corresponding to the time interval between the time event of the signal to be measured X and the time event of the reference clock signal CLK in synchronization with the reference clock signal CLK. In the integrator 60, the count value DCNT is integrated when the reset signal RST is at the low level and the time-to-digital value TD is initialized to zero when the reset signal RST becomes the high level. The time-to-digital value TD corresponds to a "first time-to-digital value" in the invention.

The converter 70 generates a time-to-digital value TDX obtained by converting the time-to-digital value TD generated by the integrator 60. For example, the converter 70 may perform predetermined scaling on the time-to-digital value TD to generate the time-to-digital value TDX or may convert the time-to-digital value TD into the time-to-digital value TDX according to a predetermined conversion equation or table information. The calculator 3 may not include the converter 70.

In the embodiment, the time event of the reference clock signal CLK is set independently of the time event of the signal to be measured X. That is, the time event of the reference clock signal CLK is asynchronous with the time event of the signal to be measured X. Accordingly, it is possible to use the time-to-digital value TD or the time-to-digital value TDX as a time-stamp corresponding to the time event of the signal to be measured X.

In the transition state acquisition device 1, the time-to-digital value TD or the time-to-digital value TDX may be output to the outside from a terminal (not shown) or may be stored in a storage such as a register and may be output to the outside through a communication interface circuit.

In the following description, the calculator 3 is assumed not to include the converter 70.

Figure 11:
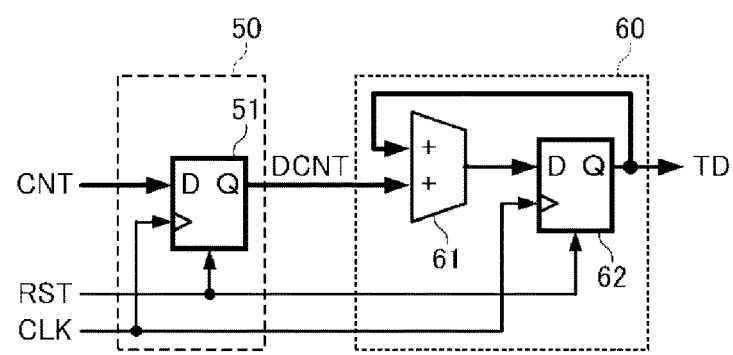
FIG. 11 is a diagram showing a specific configuration example of a calculator.

FIG. 11 is a diagram showing a specific configuration example of the calculator 3. In the example of FIG. 11, the calculator 3 includes a D flip-flop 51, an adder 61, and a D flip-flop 62. Only one D flip-flop 51 and one D flip-flop 62 are respectively illustrated for the sake of simplicity of illustration in FIG. 11. However, there are actually N D flip-flops 51 and M D flip-flops 62. The N D flip-flops 51 corresponds to the count value holder 50 shown in FIG. 10. Further, a circuit configured of the adder 61 and the M D flip-flops 62 corresponds to the integrator 60 shown in FIG. 10.

The N D flip-flops 51 captures the N-bit count value CNT output from the transition state acquisition device 1 in synchronization with the rising edge of the reference clock signal CLK and holds the value as the count value DCNT.

The adder 61 adds an N-bit count value DCNT held by the N D flip-flops 51 and an M-bit value held by the M D flip-flops 62 and outputs an M-bit signal. Further, in a case where the addition value is equal to or larger than an M-bit upper limit value, the adder 61 outputs the M-bit signal having the upper limit value. For example, when M=8, the adder 61 outputs an eight-bit signal having any value of zero to 255.

Each of the M D flip-flops 62 captures each value of the M-bit signal output from the adder 61 in synchronization with the rising edge of the reference clock signal CLK and holds the value as the time-to-digital value TD. When the reset signal RST is changed from the low level to the high level, the values respectively held by the N D flip-flops 51 and the M D flip-flops 62 are all initialized to zero. Accordingly, the time-to-digital value TD is also initialized to zero, and next measurement is possible.

Figure 12:
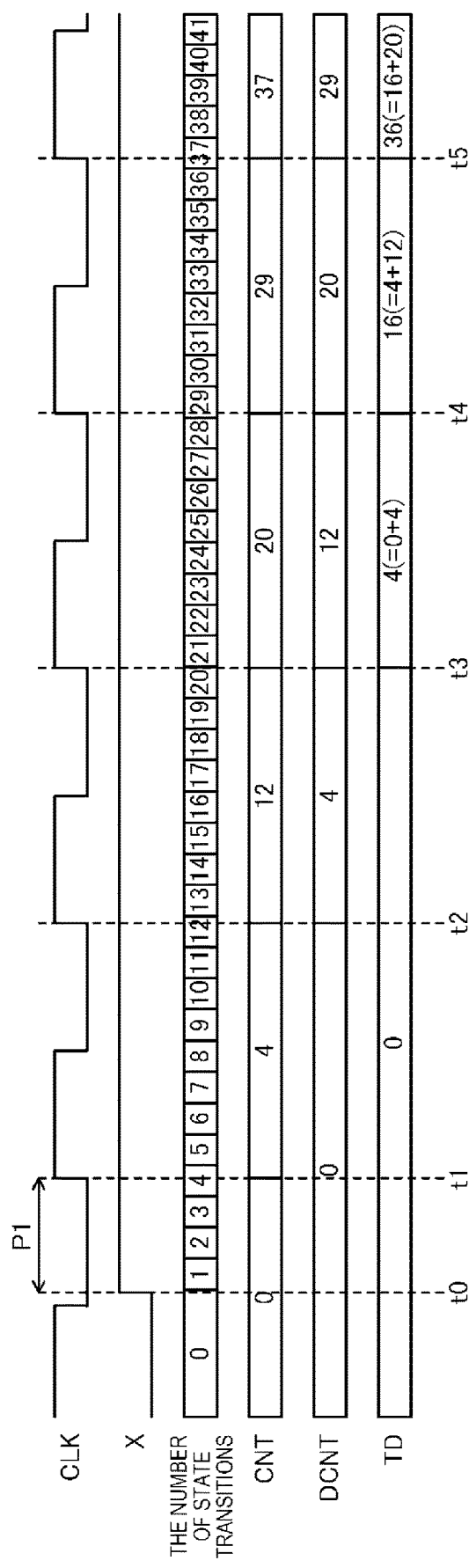
FIG. 12 is a diagram showing an example of a timing chart in the time-to-digital converter.
Figure 13:
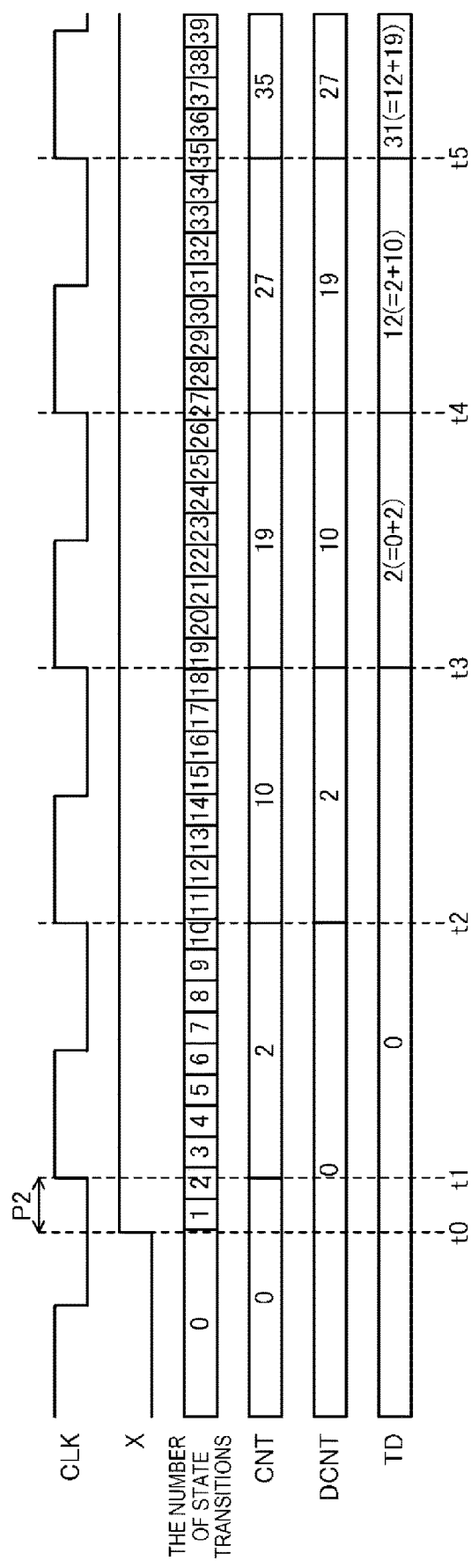
FIG. 13 is a diagram showing another example of the timing chart in the time-to-digital converter.

Next, a detail operation of the time-to-digital converter 2 will be described using FIGS. 12 and 13. FIGS. 12 and 13 are diagrams showing examples of timing charts in the time-to-digital converter 2. In the example of FIG. 12, the time interval between the rising edge of the signal to be measured X and the rising edge of the reference clock signal CLK is P1. In the example of FIG. 13, a time interval P2 between the rising edge of the signal to be measured X and the rising edge of the reference clock signal CLK is shorter than P1.

In the example of FIG. 12, when the signal to be measured X transitions from the low level to the high level at time t0, the state transition of the oscillator 20 of the transition state acquisition device 1 starts and the number of state transitions increases by one.

At time t0 to time t1 at which a time P1 elapses, a first rising edge of the reference clock signal CLK after the signal to be measured X transitions to the high level comes and the count value CNT is changed from zero to four in synchronization with the edge.

At time t2, a second rising edge of the reference clock signal CLK comes and the count value CNT is changed from four to 12 in synchronization with the edge. Further, the count value DCNT is changed from zero to four in synchronization with the edge.

At time t3, a third rising edge of the reference clock signal CLK comes, and the count value CNT is changed from 12 to 20 and the count value DCNT is changed from four to 12 in synchronization with the edge. Further, the time-to-digital value TD is changed from zero to four in synchronization with the edge.

At time t4, a fourth rising edge of the reference clock signal CLK comes, and the count value CNT is changed from 20 to 29, the count value DCNT is changed from 12 to 20, and the time-to-digital value TD is changed from four to 16 in synchronization with the edge.

At time t5, a fifth rising edge of the reference clock signal CLK comes, and the count value CNT is changed from 29 to 37, the count value DCNT is changed from 20 to 29, and the time-to-digital value TD is changed from 16 to 36 in synchronization with the edge.

In the example of FIG. 13, when the signal to be measured X transitions from the low level to the high level at time t0, the state transition of the oscillator 20 of the transition state acquisition device 1 also starts and the number of state transitions increases by one.

At time t0 to time t1 at which a time P2 elapses, the first rising edge of the reference clock signal CLK after the signal to be measured X transitions to the high level comes and the count value CNT is changed from zero to two in synchronization with the edge.

At time t2, the second rising edge of the reference clock signal CLK comes and the count value CNT is changed from two to 10 in synchronization with the edge. Further, the count value DCNT is changed from zero to two in synchronization with the edge.

At time t3, the third rising edge of the reference clock signal CLK comes, and the count value CNT is changed from 10 to 19 and the count value DCNT is changed from two to 10 in synchronization with the edge. Further, the time-to-digital value TD is changed from zero to two in synchronization with the edge.

At time t4, the fourth rising edge of the reference clock signal CLK comes, and the count value CNT is changed from 19 to 27, the count value DCNT is changed from 10 to 19, and the time-to-digital value TD is changed from two to 12 in synchronization with the edge.

At time t5, the fifth rising edge of the reference clock signal CLK comes, and the count value CNT is changed from 27 to 35, the count value DCNT is changed from 19 to 27, and the time-to-digital value TD is changed from 12 to 31 in synchronization with the edge.

Here, the time P1 from time t0 to time t1 in the example of FIG. 12 is longer than the time P2 from time t0 to time t1 in the example of FIG. 13. Further, the time-to-digital value TD in the example of FIG. 12 transitions so as to have a value larger than the time-to-digital value TD in the example of FIG. 13 at each time. Accordingly, when the integration by the integrator 60 is stopped and the time-to-digital value TD is held at a time point when the rising edge of the reference clock signal CLK comes the predetermined number of times after the signal to be measured X transitions from the low level to the high level, the time-to-digital value TD becomes larger as the time interval between the rising edge of the signal to be measured X and the rising edge of the reference clock signal CLK is longer.

Figure 14:
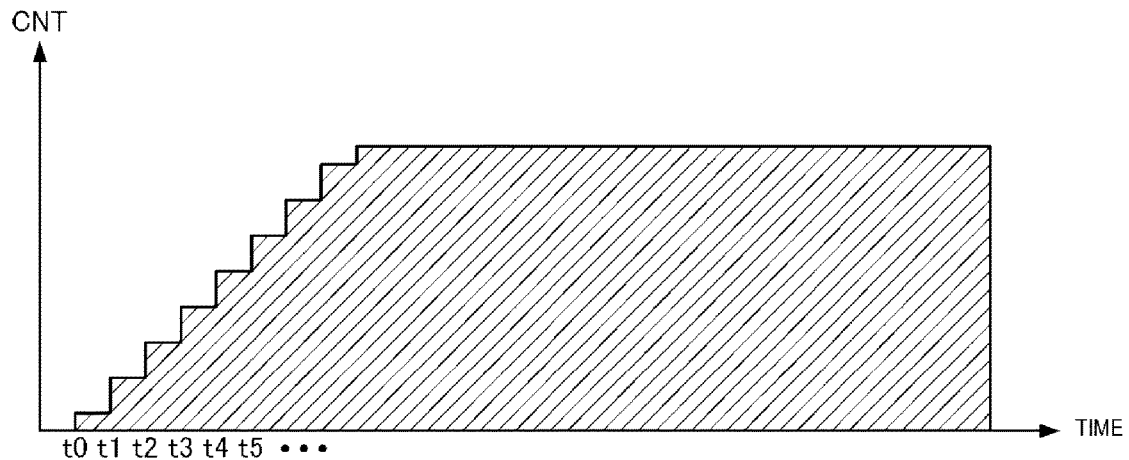
FIG. 14 is a diagram showing a time change in a count value CNT in the example of FIG. 12.
Figure 15:
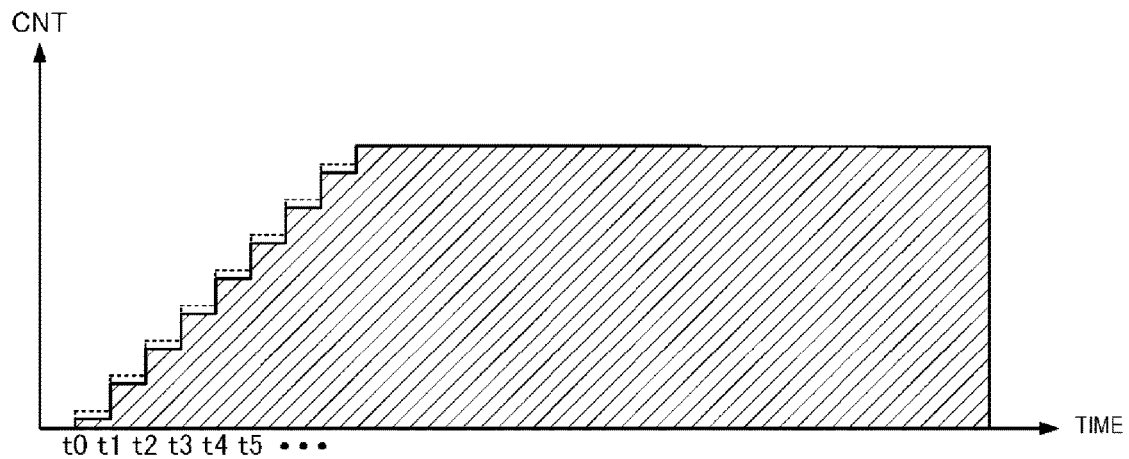
FIG. 15 is a diagram showing a time change in the count value CNT in the example of FIG. 13.

FIG. 14 is a diagram showing a time change in the count value CNT in the example of FIG. 12. Further, FIG. 15 is a diagram showing a time change in the count value CNT in the example of FIG. 13. In FIGS. 14 and 15, the horizontal axis is time and the vertical axis is the count value CNT. In FIGS. 14 and 15, an area of a hatched portion corresponding to the integration value of the count value CNT corresponds to the time-to-digital value TD which is finally obtained. In FIG. 15, the time change in the count value CNT in the example of FIG. 12 (time change in count value CNT shown in FIG. 14) is also shown by a broken line.

As shown in FIGS. 14 and 15, the time-to-digital value TD becomes larger as the count value CNT immediately after the change at time t0 is larger, that is, the time interval between the rising edge of the signal to be measured X and the rising edge of the reference clock signal CLK is longer. In other words, the count value CNT is weighted by a time according to the time interval between the rising edge of the signal to be measured X and the rising edge of the reference clock signal CLK, and the time-to-digital value TD becomes larger as the weighting by the time of the count value CNT is larger. Measurement resolution of the time interval between the rising edge of the signal to be measured X and the rising edge of the reference clock signal CLK becomes higher as a time of one period of the state transition of the oscillator 20 of the transition state acquisition device 1 is shorter. Further, since a difference between the time-to-digital value TD shown in FIG. 14 and the time-to-digital value TD shown in FIG. 15 becomes larger as a time when the count value CNT reaches the upper limit value is longer, it can be said that the measurement resolution becomes higher as the upper limit value of the count value CNT is larger. Further, a dynamic range of the measurement becomes wider by increasing the upper limit value of the count value CNT.

According to the first embodiment of the time-to-digital converter 2 as described above, the count value CNT subjected to the weighting by the time integrates the count value DCNT held by the count value holder 50 by the integrator 60 to obtain the noise shaping effect. Therefore, since a noise component due to variation in the signal propagation time of the plurality of delay elements configuring the tapped delay line 21 of the oscillator 20 of the transition state acquisition device 1 shifts to a high-frequency side and a high-frequency component is removed by the integrator 60, it is possible to improve accuracy of the time-stamp for the time event of the signal to be measured X. Further, there is no need to correct the variation in the signal propagation time of the plurality of delay elements by obtaining the noise shaping effect.

Further, according to the first embodiment of the time-to-digital converter 2, it is possible to improve the resolution and the dynamic range by increasing the upper limit value of the count value CNT even without increasing the number of the delay elements configuring the tapped delay line 21 of the oscillator 20 of the transition state acquisition device 1.

Further, since the time-to-digital value TD is changed linearly with respect to the time interval between the time event of the signal to be measured X and the time event of the reference clock signal CLK by setting the upper limit value to the count value CNT output from the transition state acquisition device 1, it is easy to use the time-to-digital value TD as the time-stamp.

2-2. Second Embodiment

A second embodiment of the time-to-digital converter 2 generates time-to-digital values TDX1 to TDXm corresponding to at least two time intervals of the time events of a plurality of signals to be measured X.

Figure 16:
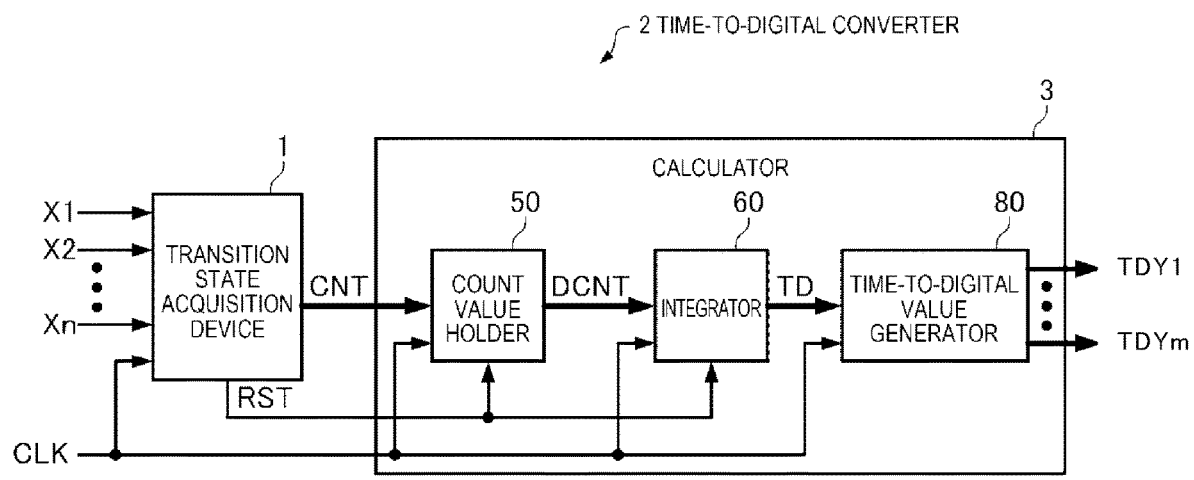
FIG. 16 is a diagram showing a configuration in a second embodiment of the time-to-digital converter.

FIG. 16 is a diagram showing a configuration in the second embodiment of the time-to-digital converter 2. As shown in FIG. 16, the second embodiment of the time-to-digital converter 2 includes the transition state acquisition device 1 and the calculator 3.

The transition state acquisition device 1 detects the time events of n (n≥2) signals to be measured X1 to Xn and sequentially outputs the count value CNT corresponding to each of the signals to be measured X1 to Xn. In the embodiment, it is assumed that each time event of the signals to be measured X1 to Xn comes in this order at intervals of a predetermined time or more. In the transition state acquisition device 1, when the time event of the signal to be measured Xi (i is each of 1 to n-1) comes, the count value CNT with respect to the signal to be measured Xi is output and then the count value CNT is initialized to zero by the reset signal RST. Thereafter, when the time event of the signal to be measured Xi+1 comes, the count value CNT with respect to the signal to be measured Xi+1 is output.

Specifically, in the transition state acquisition device 1 having the configuration shown in FIG. 1, the oscillator 20 starts the transition of the state of the tapped delay line 21 based on each of the signals to be measured X1 to Xn, and the latch 30 holds the signal sequentially output from the tapped delay line 21 with respect to each of the signals to be measured X1 to Xn. The counter 40 counts the number of times the state of the tapped delay line 21 transitions with respect to each of the signals to be measured X1 to Xn based on the value sequentially held by the latch 30 and sequentially outputs n count values CNT with respect to the signals to be measured X1 to Xn.

The calculator 3 includes the count value holder 50, the integrator 60, and a time-to-digital value generator 80.

The count value holder 50 captures the n count values CNT sequentially output from the transition state acquisition device 1 in synchronization with the reference clock signal CLK and holds the values as the count value DCNT. In the count value holder 50, the count value DCNT is held when the reset signal RST output from the transition state acquisition device 1 is at the low level and the count value DCNT is initialized to zero when the reset signal RST becomes the high level.

The integrator 60 integrates each of n count values DCNT sequentially held by the count value holder 50 in synchronization with the reference clock signal CLK to sequentially generate n time-to-digital values TD corresponding to the time interval between the time event of each of the signals to be measured X1 to Xn and the time event of the reference clock signal CLK. In the integrator 60, the count value DCNT is integrated when the reset signal RST is at the low level and the time-to-digital value TD is initialized to zero when the reset signal RST becomes the high level.

The time-to-digital value generator 80 generates the time-to-digital values TDX1 to TDXm corresponding to the time intervals of at least two time events of the signals to be measured X1 to Xn based on the n time-to-digital values TD with respect to the signals to be measured X1 to Xn in synchronization with the reference clock signal CLK. For example, m=n-1, and the time-to-digital value TDXi (i is each of 1 to n-1) may be a difference between the time-to-digital value TD with respect to the signal to be measured Xi+1 and the time-to-digital value TD with respect to the signal to be measured Xi. That is, the time-to-digital value TDXi may correspond to the time interval between the time event of Xi and the time event of Xi+1. The time-to-digital value TD corresponds to the "first time-to-digital value" in the invention, and each of the time-to-digital values TDX1 to TDXm corresponds to a "second time-to-digital value" in the invention.

In the embodiment, the time event of the reference clock signal CLK is set independently of the time events of the signals to be measured X1 to Xn. That is, the time event of the reference clock signal CLK is asynchronous with the time events of the signals to be measured X1 to Xn. Accordingly, it is possible to use time-to-digital values TD1 to TDn as time-stamps corresponding to the time intervals of the time events of the signals to be measured X1 to Xn, and it is possible to acquire the time-to-digital values TDX1 to TDXm corresponding to the time intervals of at least two time events of the signals to be measured X1 to Xn using these time-stamps.

The time-to-digital value generator 80 may perform predetermined scaling on the time-to-digital values TDX1 to TDXm and output the values, or may convert the time-to-digital values TDX1 to TDXm according to a predetermined conversion equation or table information and output the converted values.

According to the second embodiment of the time-to-digital converter 2 as described above, it is possible to achieve the same effects as those of the first embodiment of the time-to-digital converter 2.

Further, according to the second embodiment of the time-to-digital converter 2, since the time-to-digital values TDX1 to TDXm are generated by using the transition state acquisition device 1, the count value holder 50, and the integrator 60 together with respect to the signals to be measured X1 to Xn, it is possible to realize the miniaturization.

2-3. Third Embodiment

A third embodiment of the time-to-digital converter 2 generates time-to-digital values TDY1 to TDYm corresponding to at least two time intervals of the time events of a plurality of signals to be measured X similarly to the second embodiment. However, a plurality of transition state acquisition devices 1 are used in the third embodiment of the time-to-digital converter 2.

Figure 17:
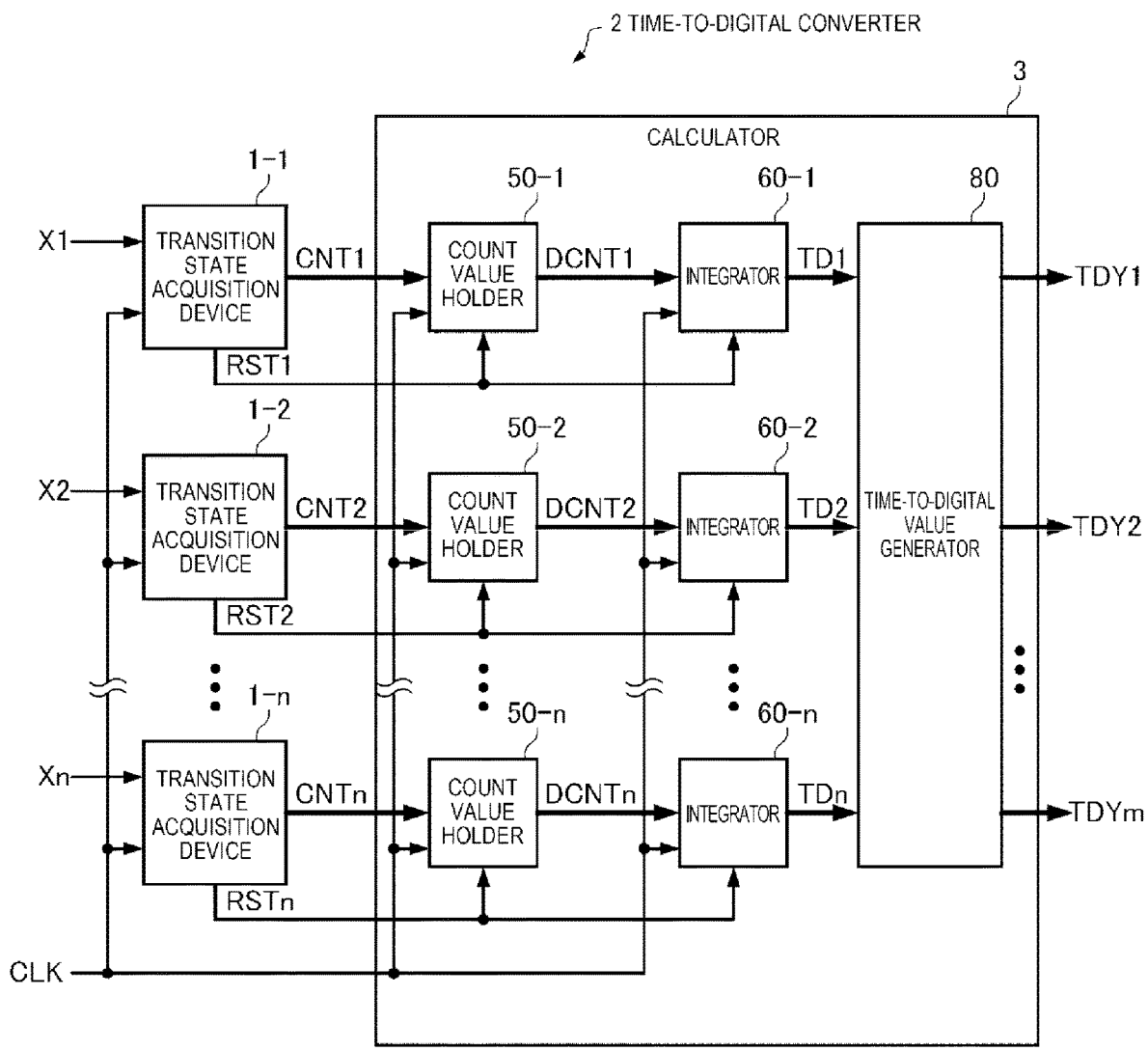
FIG. 17 is a diagram showing a configuration in a third embodiment of the time-to-digital converter.

FIG. 17 is a diagram showing a configuration in the third embodiment of the time-to-digital converter 2. As shown in FIG. 17, the third embodiment of the time-to-digital converter 2 includes n (n≥2) transition state acquisition devices 1-1 to 1-n and the calculator 3.

The transition state acquisition devices 1-1 to 1-n start the transition of the state of the tapped delay line 21 based on each of the n signals to be measured X1 to Xn, respectively detect the time events of the signals to be measured X1 to Xn, and respectively output the count values CNT1 to CNTn.

The calculator 3 includes n count value holders 50-1 to 50-n, n integrators 60-1 to 60-n, and the time-to-digital value generator 80.

The count value holders 50-1 to 50-n capture the count values CNT1 to CNTn output from each of the transition state acquisition devices 1-1 to 1-n in synchronization with the reference clock signal CLK and hold the values as count values DCNT1 to DCNTn. In the count value holders 50-1 to 50-n, the count values DCNT1 to DCNTn are held when reset signals RST1 to RSTn respectively output from the transition state acquisition devices 1-1 to 1-n are at the low level and the count values DCNT1 to DCNTn are initialized to zero when the reset signals RST1 to RSTn become the high level.

The integrators 60-1 to 60-n integrate each of the count values DCNT1 to DCNTn held by the count value holders 50-1 to 50-n in synchronization with the reference clock signal CLK to generate the n time-to-digital values TD1 to TDn corresponding to the time interval between the time event of each of the signals to be measured X1 to Xn and the time event of the reference clock signal CLK. In the integrators 60-1 to 60-n, the count values DCNT1 to DCNTn are integrated when the reset signals RST1 to RSTn are at the low level and the time-to-digital values TD1 to TDn are initialized to zero when the reset signals RST1 to RSTn become the high level.

The time-to-digital value generator 80 generates the time-to-digital values TDY1 to TDYm corresponding to the time intervals of at least two time events of the signals to be measured X1 to Xn based on the time-to-digital values TD1 to TDn generated by the integrators 60-1 to 60-n in synchronization with the reference clock signal CLK. For example, m=n-1, and the time-to-digital value TDYi (i is each of 1 to n-1) may be a difference between the time-to-digital value TDi+1 and the time-to-digital value TDi. That is, the time-to-digital value TDYi may correspond to the time interval between the time event of Xi and the time event of Xi+1. Each of the time-to-digital values TD1 to TDn corresponds to the "first time-to-digital value" in the invention, and each of the time-to-digital values TDY1 to TDYm corresponds to the "second time-to-digital value" in the invention.

In the embodiment, the time event of the reference clock signal CLK is set independently of the time events of the signals to be measured X1 to Xn. That is, the time event of the reference clock signal CLK is asynchronous with the time events of the signals to be measured X1 to Xn. Accordingly, it is possible to use time-to-digital values TD1 to TDn as the time-stamps corresponding to the time intervals of the time events of the signals to be measured X1 to Xn, and it is possible to acquire the time-to-digital values TDY1 to TDYm corresponding to the time intervals of at least two time events of the signals to be measured X1 to Xn using these time-stamps.

The time-to-digital value generator 80 may perform pre-determined scaling on the time-to-digital values TDY1 to TDYm and output the values, or may convert the time-to-digital values TDY1 to TDYm according to a predetermined conversion equation or table information and output the converted values.

According to the third embodiment of the time-to-digital converter 2 as described above, it is possible to achieve the same effects as those of the first embodiment of the time-to-digital converter 2.

Further, according to the third embodiment of the time-to-digital converter 2, since the transition state acquisition devices 1-1 to 1-n, the count value holders 50-1 to 50-n, and the integrators 60-1 to 60-n operate in parallel with respect to the signals to be measured X1 to Xn, it is possible to generate the time-to-digital values TDY1 to TDYm even in a case where the time intervals when the time events of the signals to be measured X1 to Xn come are short.

3. A/D Conversion Circuit

Next, an A/D conversion circuit by using the time-to-digital converter 2 will be described.

3-1. First Embodiment

Figure 18:
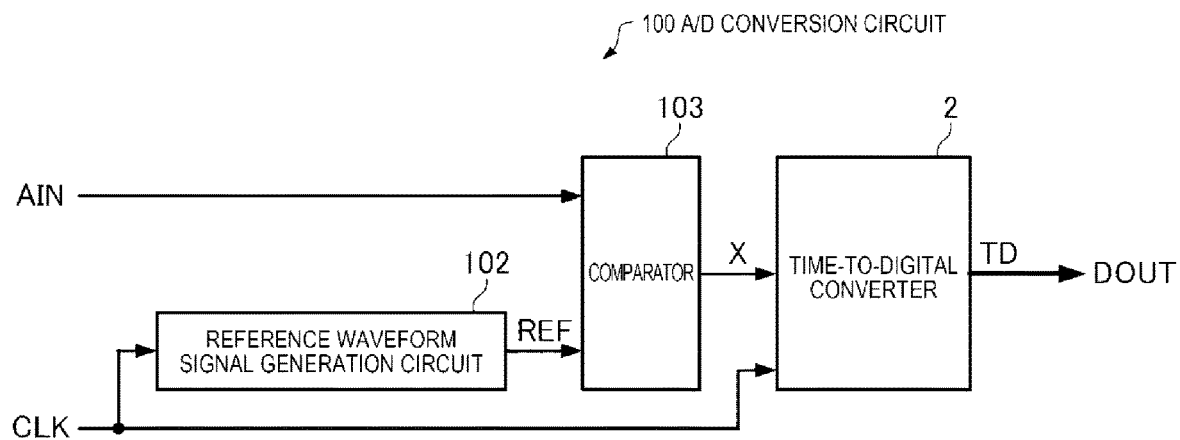
FIG. 18 is a diagram showing a configuration in a first embodiment of an A/D conversion circuit.

FIG. 18 is a diagram showing a configuration in a first embodiment of an A/D conversion circuit 100. As shown in FIG. 18, the first embodiment of the A/D conversion circuit 100 includes a reference waveform signal generation circuit 102, a comparator 103, and the time-to-digital converter 2, and converts an input analog signal AIN into a digital signal DOUT and outputs the converted digital signal.

The reference waveform signal generation circuit 102 generates a reference waveform signal REF based on the reference clock signal CLK. The reference waveform signal REF is a signal whose voltage changes at the same period as that of the reference clock signal CLK, and, for example, may be a triangular wave signal, a ramp wave signal, a sine wave signal, a cosine wave signal, or the like.

The comparator 103 compares a voltage of the analog signal AIN with a voltage of the reference waveform signal REF generated by the reference waveform signal generation circuit 102 to output the signal to be measured X.

The time-to-digital converter 2 outputs the time-to-digital value TD corresponding to the time interval between the time event of the signal to be measured X and the time event of the reference clock signal CLK.

The A/D conversion circuit 100 outputs the digital signal DOUT based on the time-to-digital value TD. For example, the A/D conversion circuit 100 may output the digital signal DOUT having the time-to-digital value TD, or may convert the time-to-digital value TD into the digital signal DOUT having a value that linearly changes with respect to the voltage of the analog signal AIN and output the converted digital signal.

Figure 19:
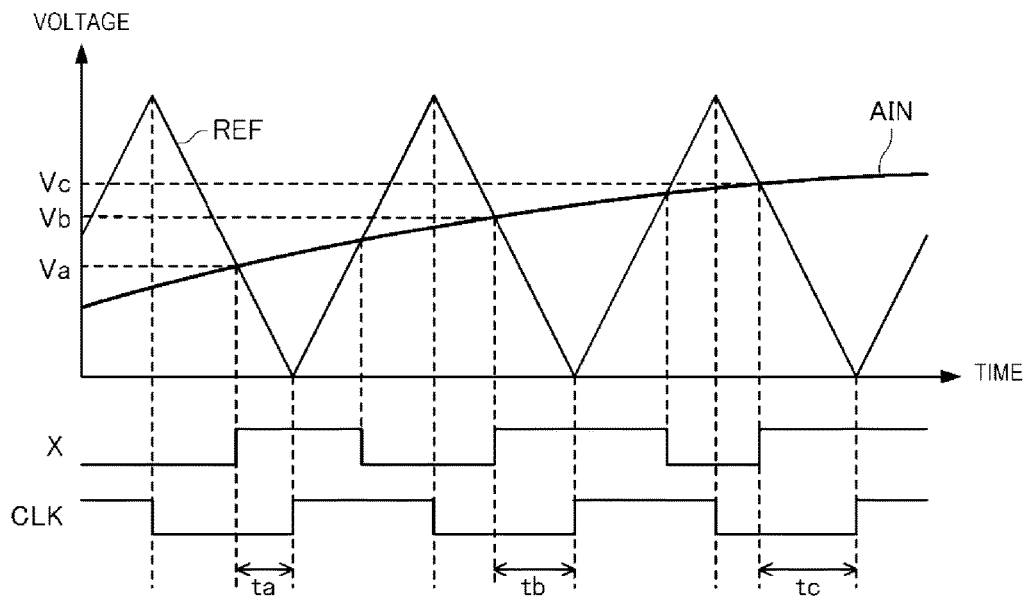
FIG. 19 is a diagram showing an example of waveforms of various signals in the first embodiment of the A/D conversion circuit.

FIG. 19 is a diagram showing an example of waveforms of various signals in the first embodiment of the A/D conversion circuit 100. In the example of FIG. 19, the reference waveform signal REF is the triangular wave signal having the minimum voltage at the rising edge of the reference clock signal CLK and the maximum voltage at a falling edge of the reference clock signal CLK. Further, the signal to be measured X becomes the high level when the voltage of the analog signal AIN is higher than the voltage of the reference waveform signal REF and becomes the low level when the voltage of the analog signal AIN is lower than the voltage of the reference waveform signal REF.

In the example of FIG. 19, when values of the voltage of the analog signal AIN are Va, Vb, and Vc, the time intervals between the rising edge of the signal to be measured X and the rising edge of the reference clock signal CLK are ta, tb, and tc, respectively. The ta<tb<tc with respect to Va<Vb<Vc, and the time intervals between the rising edge of the signal to be measured X and the rising edge of the reference clock signal CLK linearly change with respect to the voltages of the analog signal AIN. Accordingly, the A/D conversion circuit 100 can output the digital signals DOUT having the time-to-digital values TD corresponding to ta, tb, and tc.

According to the first embodiment of the A/D conversion circuit 100, it is possible to realize high accuracy, high resolution, high speed processing, low power consumption, miniaturization, and the like by using the time-to-digital converter 2.

Figure 20:
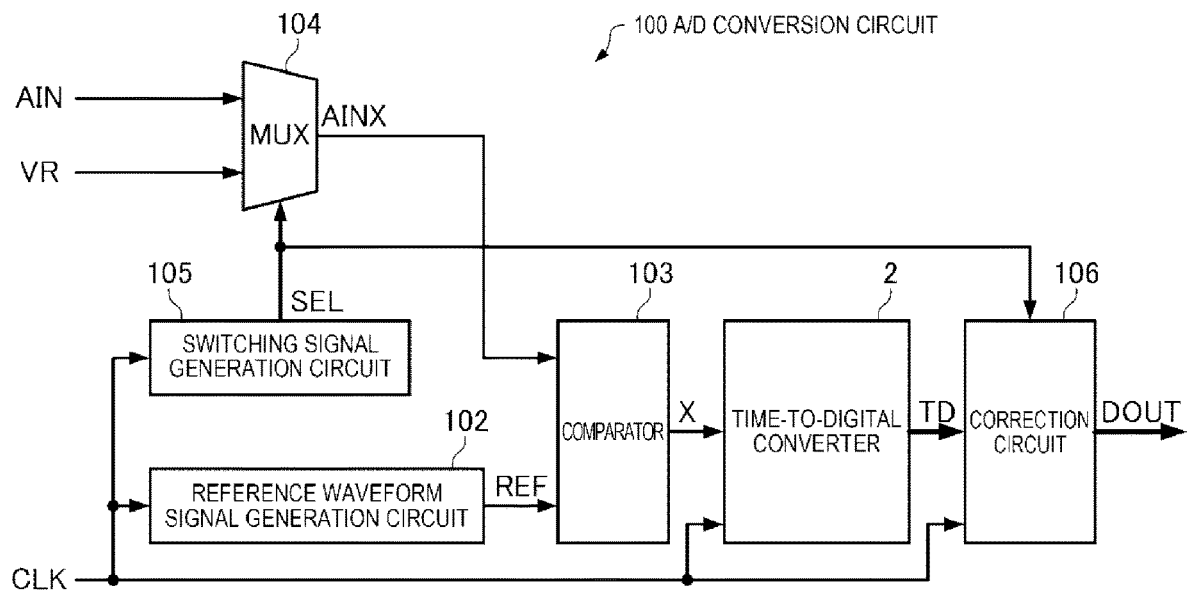
FIG. 20 is a diagram showing a modification example of the first embodiment of the A/D conversion circuit.

FIG. 20 is a diagram showing a modification example of the first embodiment of the A/D conversion circuit 100. A calibration function is added to the A/D conversion circuit 100 shown in FIG. 20 with respect to the A/D conversion circuit 100 shown in FIG. 18. In FIG. 20, the same reference numeral is assigned to the same configuration element as that in FIG. 18, and the description thereof is omitted.

The A/D conversion circuit 100 shown in FIG. 20 includes the reference waveform signal generation circuit 102, the comparator 103, and the time-to-digital converter 2, and further includes a multiplexer 104, a switching signal generation circuit 105, and a correction circuit 106.

The multiplexer 104 selects the analog signal AIN when a switching signal SEL is at the low level, selects a reference voltage VR when the switching signal SEL is at the high level, and outputs the selected analog signal AIN or reference voltage VR as an analog signal AINX. The reference voltage VR is a constant voltage set in advance.

The switching signal generation circuit 105 generates the switching signal SEL in synchronization with the reference clock signal CLK. For example, the switching signal generation circuit 105 sets the switching signal SEL from the low level to the high level immediately before the A/D conversion circuit 100 starts an A/D conversion process or periodically, and sets the switching signal SEL from the high level to the low level after a predetermined time elapses.

The analog signal AINX output from the multiplexer 104 is input to the comparator 103 and is converted into the time-to-digital value TD by the reference waveform signal generation circuit 102, the comparator 103, and the time-to-digital converter 2.

When the switching signal SEL is at the high level, the correction circuit 106 calculates a difference between a reference value and the time-to-digital value TD generated with respect to the reference voltage VR in synchronization with the reference clock signal CLK and stores the difference in the register (not shown) as a correction value. Further, when the switching signal SEL is at the low level, the correction circuit 106 corrects the time-to-digital value TD generated with respect to the analog signal AIN using the correction value stored in the register to generate the digital signal DOUT.

With the modification example of the first embodiment of the A/D conversion circuit 100, since the influence of a temperature change, a power supply voltage change, an aging change, and the like can be corrected by executing the calibration using the reference voltage VR, it is possible to perform the A/D conversion with high accuracy.

3-2. Second Embodiment

Figure 21:
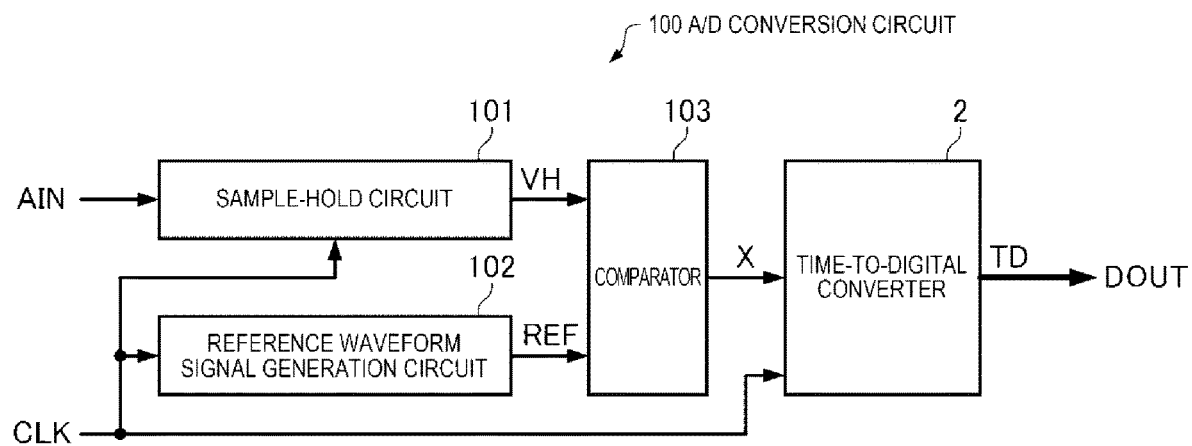
FIG. 21 is a diagram showing a configuration in a second embodiment of the A/D conversion circuit.

FIG. 21 is a diagram showing a configuration in a second embodiment of the A/D conversion circuit 100. As shown in FIG. 21, the second embodiment of the A/D conversion circuit 100 includes a sample-hold circuit 101, the reference waveform signal generation circuit 102, the comparator 103, and the time-to-digital converter 2, and converts the input analog signal AIN into the digital signal DOUT and outputs the converted digital signal.

The sample-hold circuit 101 samples and holds a voltage of the analog signal AIN in synchronization with the reference clock signal CLK.

The reference waveform signal generation circuit 102 generates the reference waveform signal REF based on the reference clock signal CLK. The reference waveform signal REF is the signal whose voltage changes at the same period as that of the reference clock signal CLK, and, for example, may be the triangular wave signal, the ramp wave signal, the sine wave signal, the cosine wave signal, or the like.

The comparator 103 compares a voltage VH held by the sample-hold circuit 101 with the voltage of the reference waveform signal REF generated by the reference waveform signal generation circuit 102 to output the signal to be measured X.

The time-to-digital converter 2 outputs the time-to-digital value TD corresponding to the time interval between the time event of the signal to be measured X and the time event of the reference clock signal CLK.

The A/D conversion circuit 100 outputs the digital signal DOUT based on the time-to-digital value TD. For example, the A/D conversion circuit 100 may output the digital signal DOUT having the time-to-digital value TD, or may convert the time-to-digital value TD into the digital signal DOUT having a value that linearly changes with respect to the voltage of the analog signal AIN and output the converted digital signal.

Figure 22:
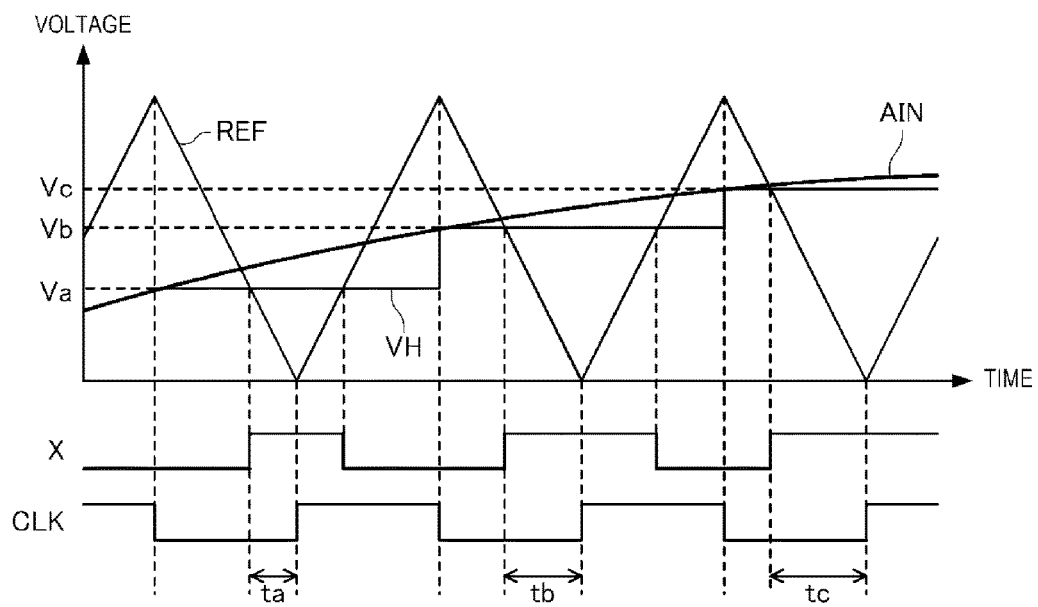
FIG. 22 is a diagram showing an example of the waveforms of the various signals in the second embodiment of the A/D conversion circuit.

FIG. 22 is a diagram showing an example of the waveforms of the various signals in the second embodiment of the A/D conversion circuit 100. In the example of FIG. 22, the voltage of the analog signal AIN is sampled and held for each rising edge of the reference clock signal CLK. Further, the reference waveform signal REF is the triangular wave signal having the minimum voltage at the rising edge of the reference clock signal CLK and the maximum voltage at the falling edge of the reference clock signal CLK. Further, the signal to be measured X becomes the high level when the voltage VH is higher than the voltage of the reference waveform signal REF and becomes the low level when the voltage VH is lower than the voltage of the reference waveform signal REF.

In the example of FIG. 22, when values of the voltage VH at which the voltage of the analog signal AIN is held are Va, Vb, and Vc, the time intervals between the rising edge of the signal to be measured X and the rising edge of the reference clock signal CLK are ta, tb, and tc, respectively. The ta<tb<tc with respect to Va<Vb<Vc, and the time intervals between the rising edge of the signal to be measured X and the rising edge of the reference clock signal CLK linearly change with respect to the voltages of the analog signal AIN. Accordingly, the A/D conversion circuit 100 can output the digital signals DOUT having the time-to-digital values TD corresponding to ta, tb, and tc.

According to the second embodiment of the A/D conversion circuit 100, it is possible to realize high accuracy, high resolution, high speed processing, low power consumption, miniaturization, and the like by using the time-to-digital converter 2. Further, since a sample timing can be maintained constantly by the sample-hold circuit 101, it is possible to reduce jitter of an A/D conversion timing.

Figure 23:
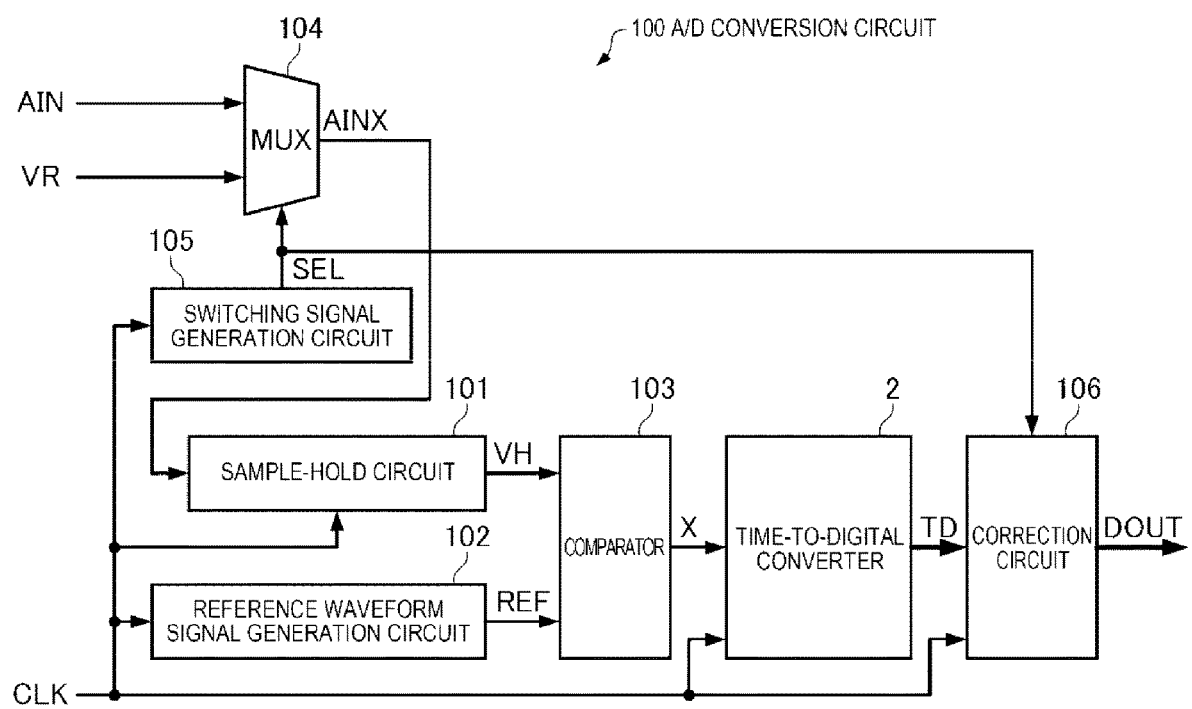
FIG. 23 is a diagram showing a modification example of the second embodiment of the A/D conversion circuit.

FIG. 23 is a diagram showing a modification example of the second embodiment of the A/D conversion circuit 100. A calibration function is added to the A/D conversion circuit 100 shown in FIG. 23 with respect to the A/D conversion circuit 100 shown in FIG. 21. In FIG. 23, the same reference numeral is assigned to the same configuration element as that in FIG. 21, and the description thereof is omitted.

The A/D conversion circuit 100 shown in FIG. 23 includes the sample-hold circuit 101, the reference waveform signal generation circuit 102, the comparator 103, and the time-to-digital converter 2, and further includes the multiplexer 104, the switching signal generation circuit 105, and the correction circuit 106.

The multiplexer 104 selects the analog signal AIN when the switching signal SEL is at the low level, selects the reference voltage VR when the switching signal SEL is at the high level, and outputs the selected analog signal AIN or reference voltage VR as the analog signal AINX. The reference voltage VR is a constant voltage set in advance.

The switching signal generation circuit 105 generates the switching signal SEL in synchronization with the reference clock signal CLK. For example, the switching signal generation circuit 105 sets the switching signal SEL from the low level to the high level immediately before the A/D conversion circuit 100 starts the A/D conversion process or periodically, and sets the switching signal SEL from the high level to the low level after a predetermined time elapses.

The analog signal AINX output from the multiplexer 104 is input to the sample-hold circuit 101 and is converted into the time-to-digital value TD by the sample-hold circuit 101, the reference waveform signal generation circuit 102, the comparator 103, and the time-to-digital converter 2.

When the switching signal SEL is at the high level, the correction circuit 106 calculates a difference between a reference value and the time-to-digital value TD generated with respect to the reference voltage VR in synchronization with the reference clock signal CLK and stores the difference in the register (not shown) as a correction value. Further, when the switching signal SEL is at the low level, the correction circuit 106 corrects the time-to-digital value TD generated with respect to the analog signal AIN using the correction value stored in the register to generate the digital signal DOUT.

With the modification example of the second embodiment of the A/D conversion circuit 100, since the influence of the temperature change, the power supply voltage change, the aging change, and the like can be corrected by executing the calibration using the reference voltage VR, it is possible to perform the A/D conversion with high accuracy. Further, since the sample timing can be maintained constantly by the sample-hold circuit 101, it is possible to reduce jitter of the A/D conversion timing.

The invention is not limited to the embodiment, and various modification forms can be employed within the scope of the gist of the invention.

The embodiments and the modification examples are examples, and the invention is not limited to thereto. For example, a combination of each embodiment and each modification example also can be employed as appropriate.

The invention includes a configuration that is substantially the same as the configuration described in the embodiment (for example, configuration having the same function, method, and result, or configuration having the same object and effect). Further, the invention includes a configuration in which a non-essential portion of the configuration described in the embodiment is replaced. Further, the invention includes a configuration that achieves the same action effect as the configuration described in the embodiment or a configuration that can achieve the same object. Further, the invention includes a configuration in which a known technique is added to the configuration described in the embodiment.

The entire disclosure of Japanese Patent Application No. 2018-054278, filed Mar. 22, 2018 is expressly incorporated by reference herein.

What is claimed is:

1. A transition state acquisition device comprising:
an oscillator that includes a tapped delay line and a combination circuit provided on a signal path from one end to the other end of the tapped delay line, and oscillates based on a first signal; and
a latch that captures and holds an output signal of the tapped delay line in synchronization with a second signal,
wherein the oscillator starts a transition of a state of the tapped delay line based on the first signal, and
wherein an interval between timings at which the latch captures the output signals of the tapped delay line is shorter than a time during which the state transition of the tapped delay line makes one round.

2. The transition state acquisition device according to claim 1,
wherein the oscillator includes a plurality of the tapped delay lines and at least some of the plurality of tapped delay lines are connected in parallel, and
wherein in a transition of values of a plurality of specific signals output from the plurality of tapped delay lines, a Hamming distance before and after the transition is 1.

3. The transition state acquisition device according to claim 1, further comprising:
a counter that counts the number of times the state of the tapped delay line transitions based on a value held by the latch.

4. The transition state acquisition device according to claim 2, further comprising:
a counter that counts the number of times the state of the tapped delay line transitions based on a value held by the latch,
wherein the counter
obtains a first count value as an approximate value of the number of times the state of the tapped delay line transitions based on values that the latch captures and holds the plurality of specific signals,
obtains a second count value by specifying the tapped delay line of which the state is transitioned at a timing when the latch captures the plurality of specific signals among the plurality of tapped delay lines based on the values that the latch captures and holds the plurality of specific signals and by performing a population count with respect to the value that the latch captures and holds the signal output from the specified tapped delay line, and
obtains the number of times the state of the tapped delay line transitions based on the first count value and the second count value.

5. A time-to-digital converter comprising:
the transition state acquisition device according to claim 3;
a count value holder that captures and holds a count value counted by the counter of the transition state acquisition device; and
an integrator that integrates the count value held by the count value holder to generate a first time-to-digital value corresponding to a time interval between a time event of the first signal and a time event of the second signal.

6. The time-to-digital converter according to claim 5, wherein the time event of the second signal is set independently of the time event of the first signal.

7. The time-to-digital converter according to claim 5, further comprising:
a time-to-digital value generator,
wherein the oscillator starts a transition of a state of the tapped delay line based on each of a plurality of the first signals,
wherein the counter counts the number of times the state of the tapped delay line transitions with respect to each of the plurality of first signals,
wherein the count value holder captures and holds a plurality of the count values counted by the counter,
wherein the integrator integrates each of the plurality of count values held by the count value holder to generate a plurality of the first time-to-digital values corresponding to a time interval between the time event of each of the plurality of first signals and the time event of the second signal, and
wherein the time-to-digital value generator generates a second time-to-digital value corresponding to a time interval of at least two time events of the plurality of first signals based on the plurality of first time-to-digital values.

8. A time-to-digital converter comprising:
a plurality of the transition state acquisition devices according to claim 3;
a plurality of count value holders;
a plurality of integrators; and
a time-to-digital value generator,
wherein the plurality of transition state acquisition devices start a transition of a state of the tapped delay line based on each of a plurality of the first signals,
wherein the plurality of count value holders capture and hold a count value counted by the counter of each of the plurality of transition state acquisition devices,
wherein the plurality of integrators integrate each of the plurality of count values held by the plurality of count value holders to generate a plurality of first time-to-digital values corresponding to a time interval between a time event of each of the plurality of first signals and a time event of the second signal, and
wherein the time-to-digital value generator generates a second time-to-digital value corresponding to a time interval of at least two time events of the plurality of first signals based on the plurality of first time-to-digital values generated by the plurality of integrators.

9. The time-to-digital converter according to claim 8, wherein the time event of the second signal is set independently of the time events of the plurality of first signals.

10. An A/D conversion circuit that converts an input analog signal into a digital signal and outputs the converted digital signal, the circuit comprising:
the time-to-digital converter according to claim 5;
a reference waveform signal generation circuit that generates a reference waveform signal based on the second signal; and
a comparator that compares a voltage of the analog signal with a voltage of the reference waveform signal to output the first signal,
wherein the A/D conversion circuit outputs the digital signal based on the first time-to-digital value generated by the time-to-digital converter.

11. An A/D conversion circuit that converts an input analog signal into a digital signal and outputs the converted digital signal, the circuit comprising:
the time-to-digital converter according to claim 5;
a sample-hold circuit that samples and holds a voltage of the analog signal;
a reference waveform signal generation circuit that generates a reference waveform signal based on the second signal; and
a comparator that compares a voltage held by the sample-hold circuit with a voltage of the reference waveform signal to output the first signal,
wherein the A/D conversion circuit outputs the digital signal based on the first time-to-digital value generated by the time-to-digital converter.

* * * * *